(12) United States Patent
Kawada et al.

(10) Patent No.: US 10,184,790 B2
(45) Date of Patent: Jan. 22, 2019

(54) PATTERN MEASUREMENT METHOD AND PATTERN MEASUREMENT DEVICE

(71) Applicant: HITACHI HIGH-TECHNOLOGIES CORPORATION, Tokyo (JP)

(72) Inventors: Hiroki Kawada, Tokyo (JP); Hideo Sakai, Tokyo (JP); Katsuhiro Sasada, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/322,338

(22) PCT Filed: May 11, 2015

(86) PCT No.: PCT/JP2015/063412
§ 371 (c)(1),
(2) Date: Dec. 27, 2016

(87) PCT Pub. No.: WO2016/002341
PCT Pub. Date: Jan. 7, 2016

(65) Prior Publication Data
US 2017/0138725 A1 May 18, 2017

(30) Foreign Application Priority Data
Jun. 30, 2014 (JP) ................................. 2014-133502

(51) Int. Cl.
*G01B 15/00* (2006.01)
*H01J 37/28* (2006.01)
(Continued)

(52) U.S. Cl.
CPC ............ *G01B 15/00* (2013.01); *G01B 15/04* (2013.01); *H01J 37/222* (2013.01); *H01J 37/28* (2013.01);
(Continued)

(58) Field of Classification Search
CPC .......... H01J 37/00; H01J 37/02; H01J 37/222; H01J 37/252; H01J 37/26; H01J 37/261; G01B 15/00; G01B 15/04; G01B 15/08
(Continued)

(56) References Cited

U.S. PATENT DOCUMENTS 6,580,072 B1* 6/2003 Chang ................ H01L 21/76888
250/297
2004/0065825 A1* 4/2004 Asaki ...................... H01J 37/28
250/310
(Continued)

FOREIGN PATENT DOCUMENTS

JP 2002-333412 A 11/2002
JP 2005-235495 A 9/2005
(Continued)

OTHER PUBLICATIONS

Office Action, dated Dec. 5, 2017, which issued during the prosecution of Japanese Patent Application No. 2016-531172, which corresponds to the present application (English translation attached).

Primary Examiner — Jason McCormack
(74) Attorney, Agent, or Firm — Baker Botts L.L.P.

(57) ABSTRACT

The presently disclosed subject matter provides a pattern measurement method and device for achieving highly accurate measurement in the depth direction of a pattern. The method involves a focused ion beam irradiated to form an inclined surface in a sample area; a field of view of a SEM set to include the boundary between the inclined surface and a sample surface; and an image of the field of view obtained on the basis of a detection signal. Such an acquired image is used to specify a first position, the boundary between inclined surface and non-inclined surface, and a second position, the position of a desired deep hole or deep groove positioned within the inclined surface. The pattern dimension in a height direction is determined on the basis of the
(Continued)

distance in the sample surface direction between the first position and second position and the angle of the inclined surface.

12 Claims, 20 Drawing Sheets

(51) Int. Cl.
  *H01J 37/317* (2006.01)
  *H01J 37/22* (2006.01)
  *G01B 15/04* (2006.01)
  *H01L 21/66* (2006.01)
(52) U.S. Cl.
  CPC ............ *H01J 37/317* (2013.01); *H01L 22/12* (2013.01); *H01J 2237/2817* (2013.01)
(58) Field of Classification Search
  USPC .................. 250/306, 307, 311, 492.1, 492.2
  See application file for complete search history.

(56) References Cited

U.S. PATENT DOCUMENTS

| | | | | |
|---|---|---|---|---|
| 2005/0127292 | A1* | 6/2005 | Kang | ................... G06K 9/0014 250/310 |
| 2006/0226376 | A1 | 10/2006 | Fujii | |
| 2009/0230299 | A1* | 9/2009 | Shichi | ..................... H01J 27/10 250/282 |
| 2010/0033560 | A1* | 2/2010 | Kawasaki | ............ G01N 23/203 348/79 |
| 2010/0224781 | A1* | 9/2010 | Hosokawa | ............ H01J 37/023 250/311 |
| 2012/0121160 | A1 | 5/2012 | Matsuoka et al. | |
| 2012/0217392 | A1* | 8/2012 | Murakawa | ............. G01B 15/00 250/307 |
| 2012/0318976 | A1* | 12/2012 | Matsumoto | ........... H01J 37/244 250/307 |
| 2013/0166240 | A1* | 6/2013 | Shishido | ................. G01B 15/04 702/97 |
| 2013/0186747 | A1 | 7/2013 | Schmidt et al. | |
| 2013/0245989 | A1* | 9/2013 | Kadowaki | .............. H01J 37/261 702/150 |
| 2015/0002652 | A1* | 1/2015 | Takasugi | ................ G01B 15/00 348/80 |
| 2015/0357159 | A1 | 12/2015 | Stone et al. | |

FOREIGN PATENT DOCUMENTS

| | | |
|---|---|---|
| JP | 2006-132975 A | 5/2006 |
| JP | 2006-294354 A | 10/2006 |
| JP | 2008-070155 A | 3/2008 |
| JP | 2014-025815 A | 2/2014 |
| WO | WO 2011/013317 A1 | 2/2011 |
| WO | WO 2014/106182 A1 | 7/2014 |

* cited by examiner

[Fig. 1]
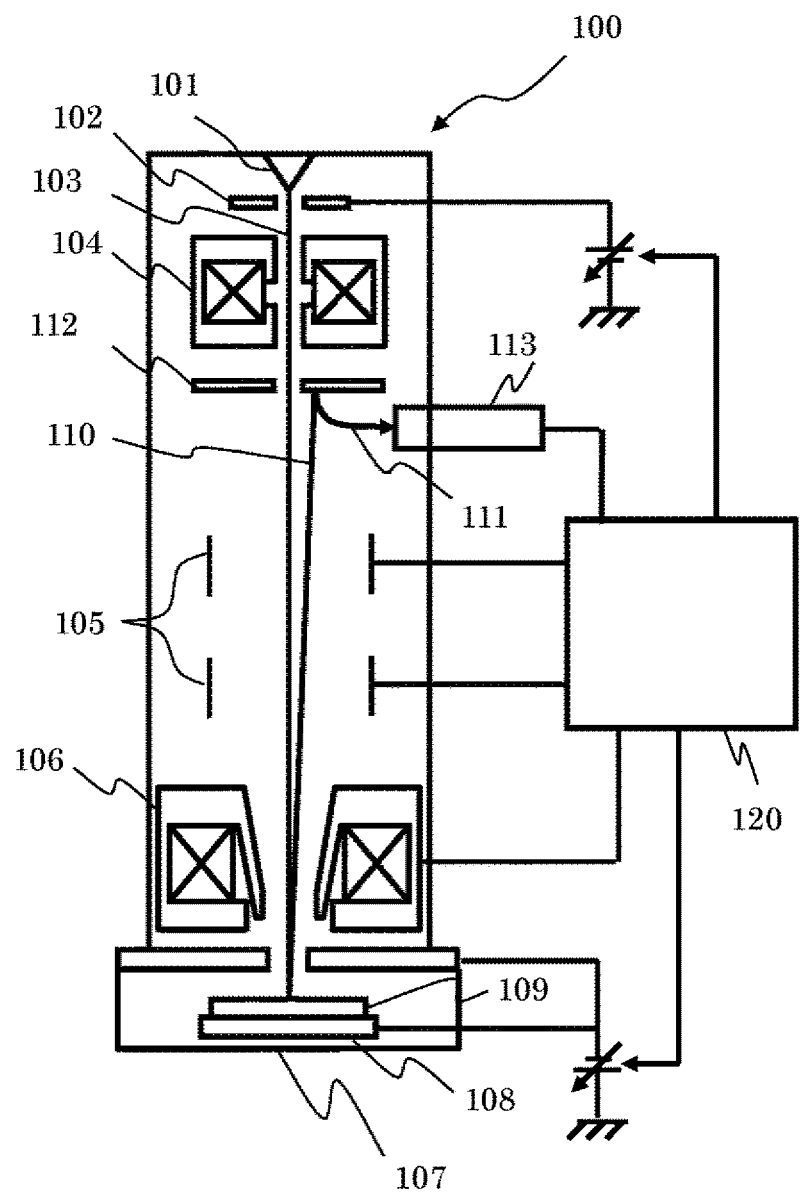

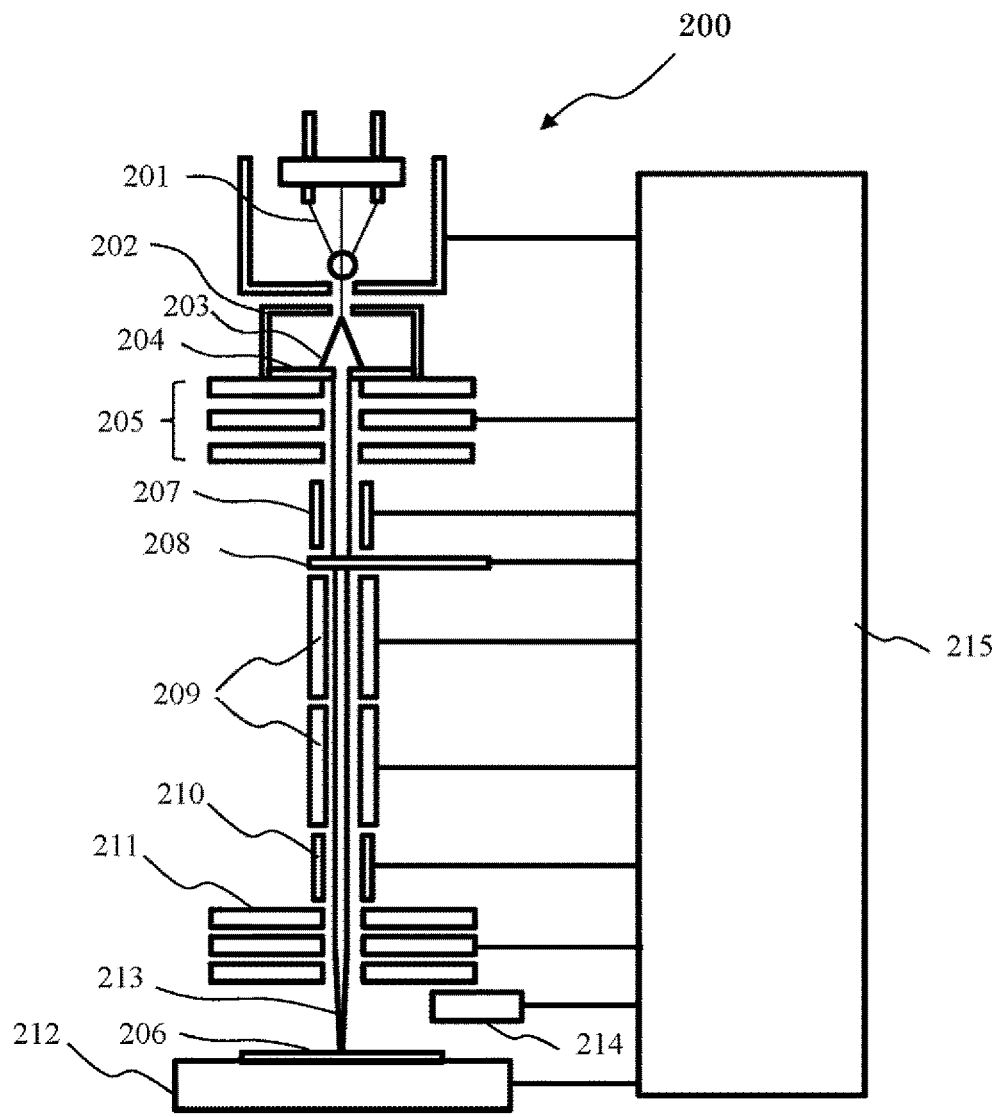
[Fig. 2]

[Fig. 3]
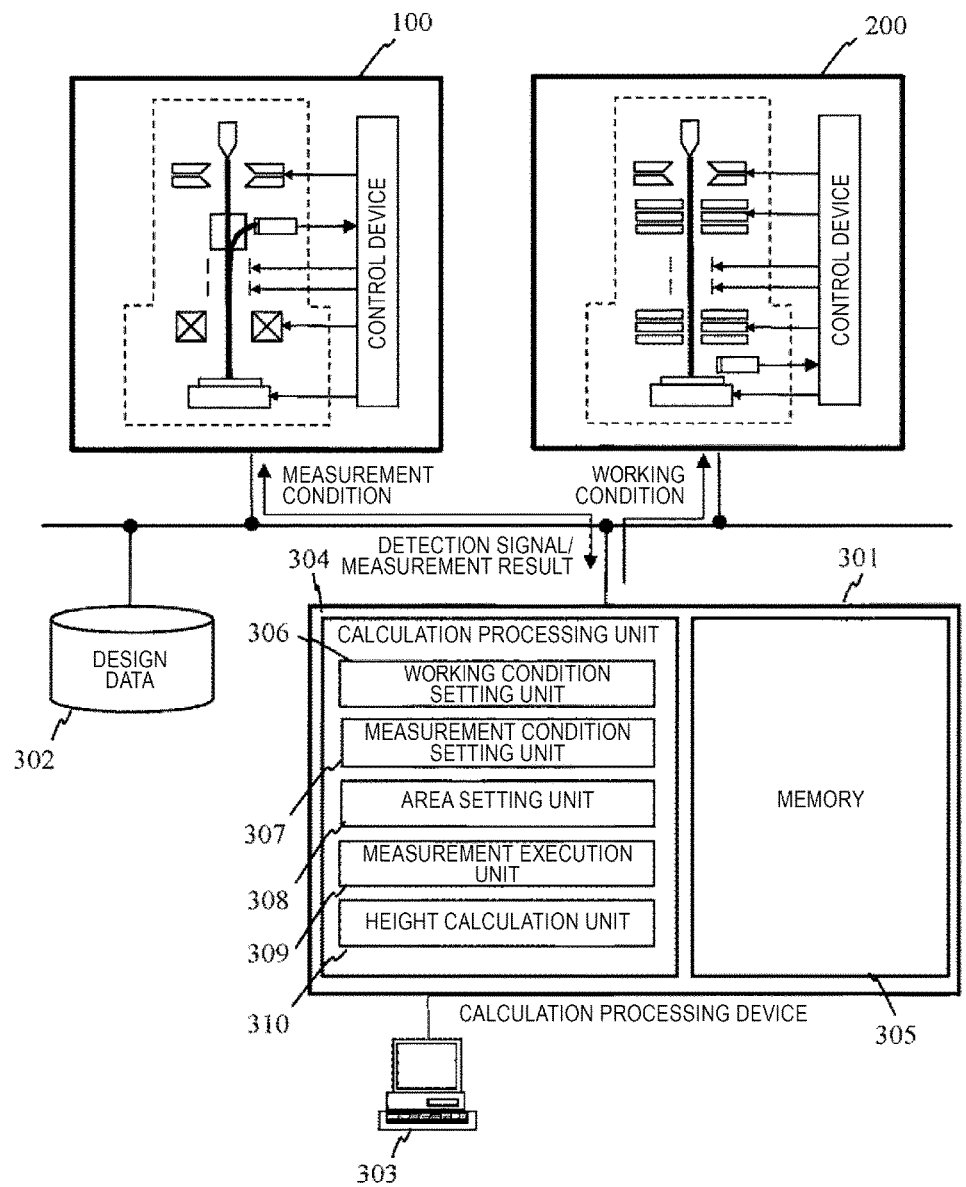

[Fig. 4]
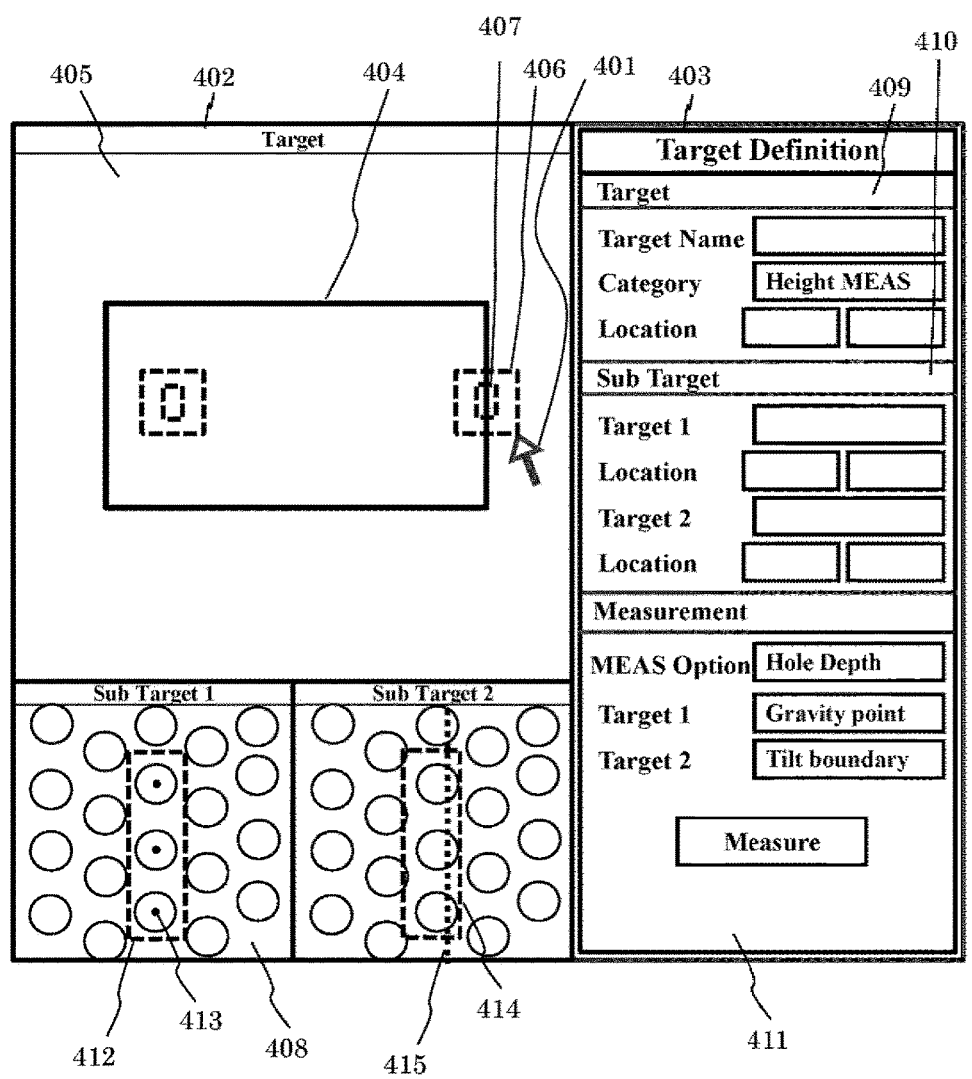

[Fig. 5]
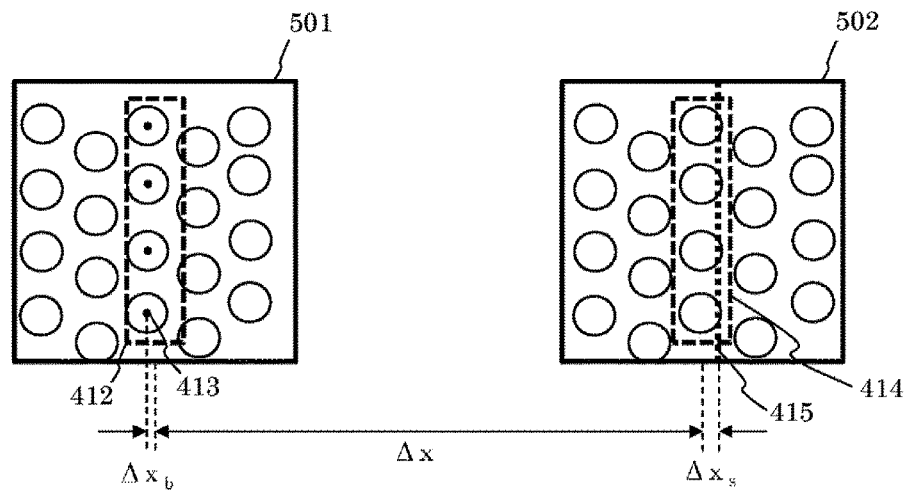
[Fig. 6]
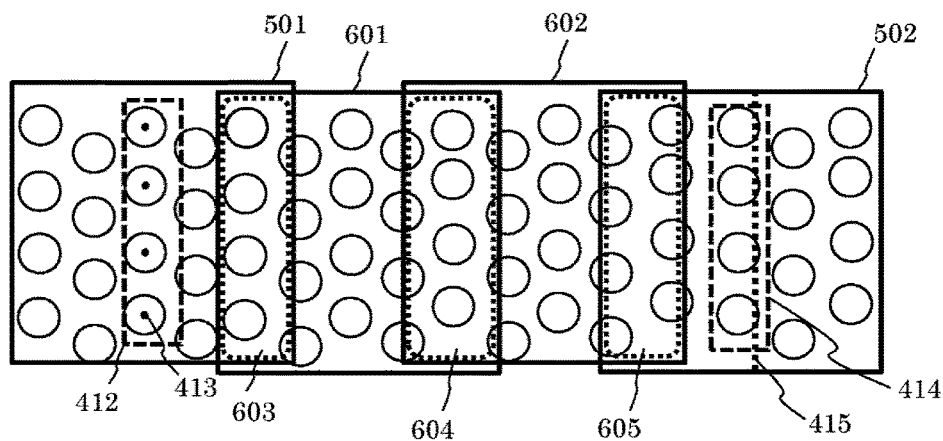

[Fig. 7]
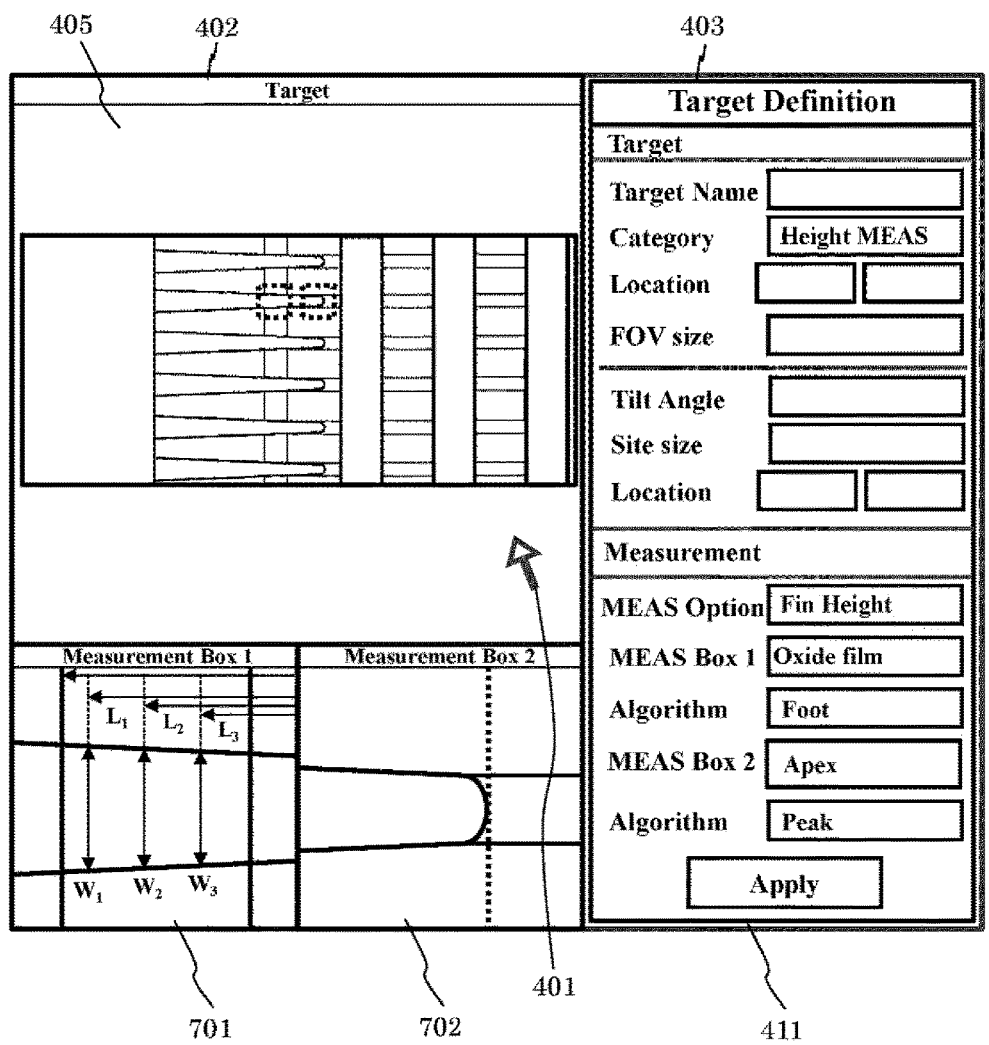

[Fig. 8]
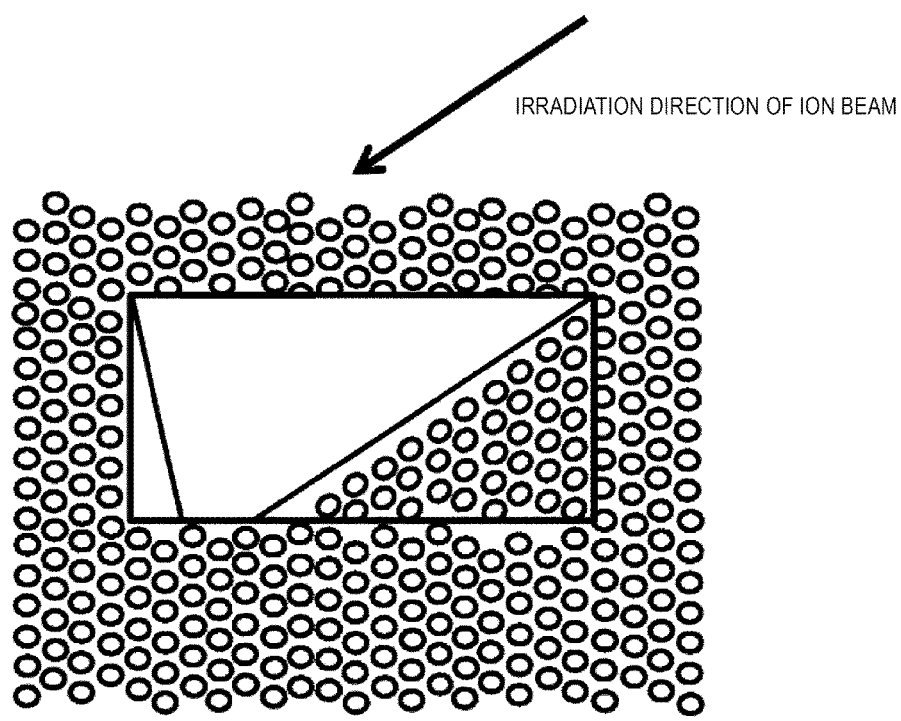

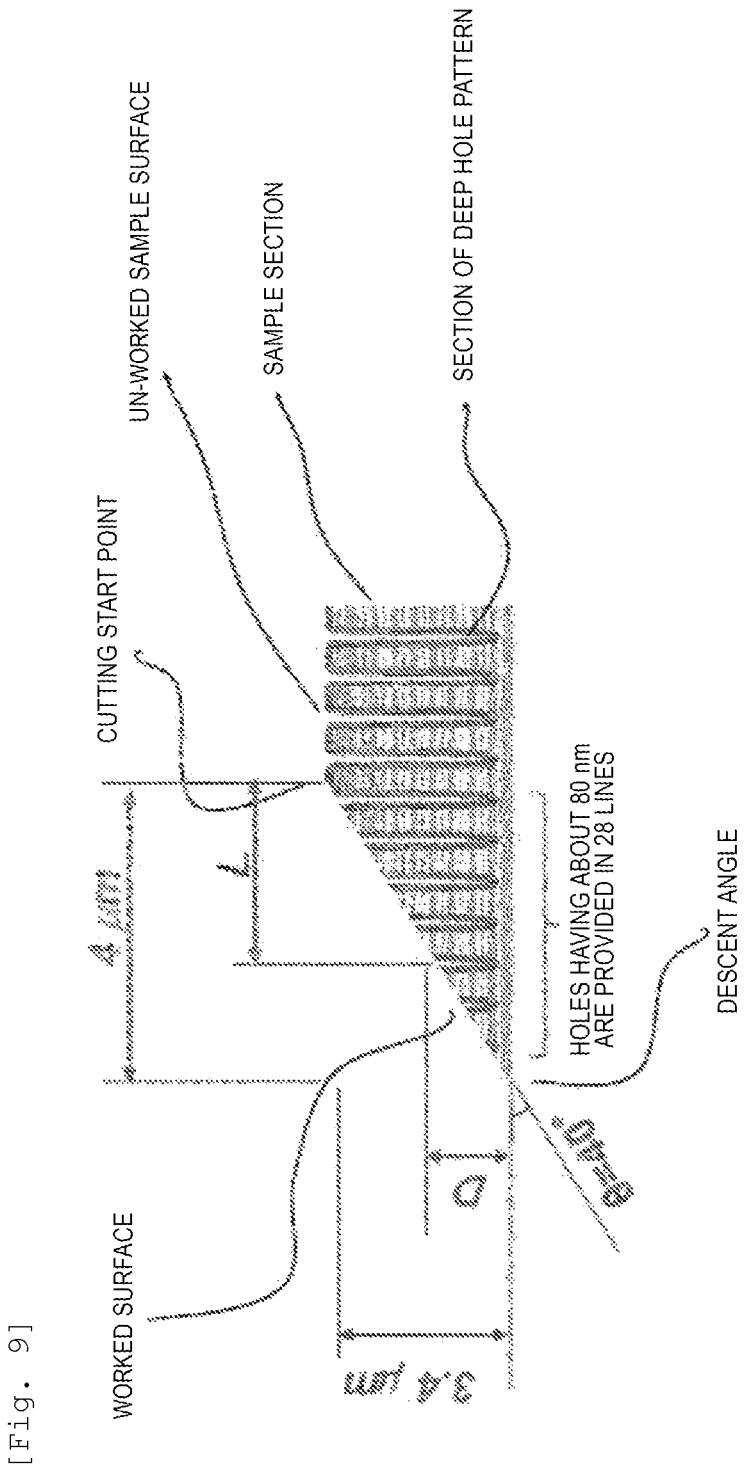
[Fig. 9]

[Fig. 10]
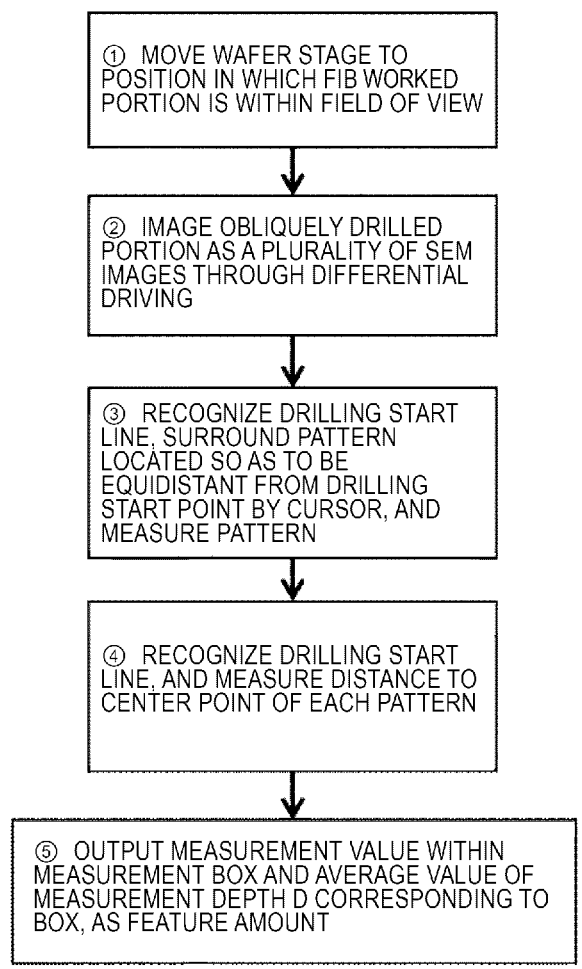

[Fig. 11]
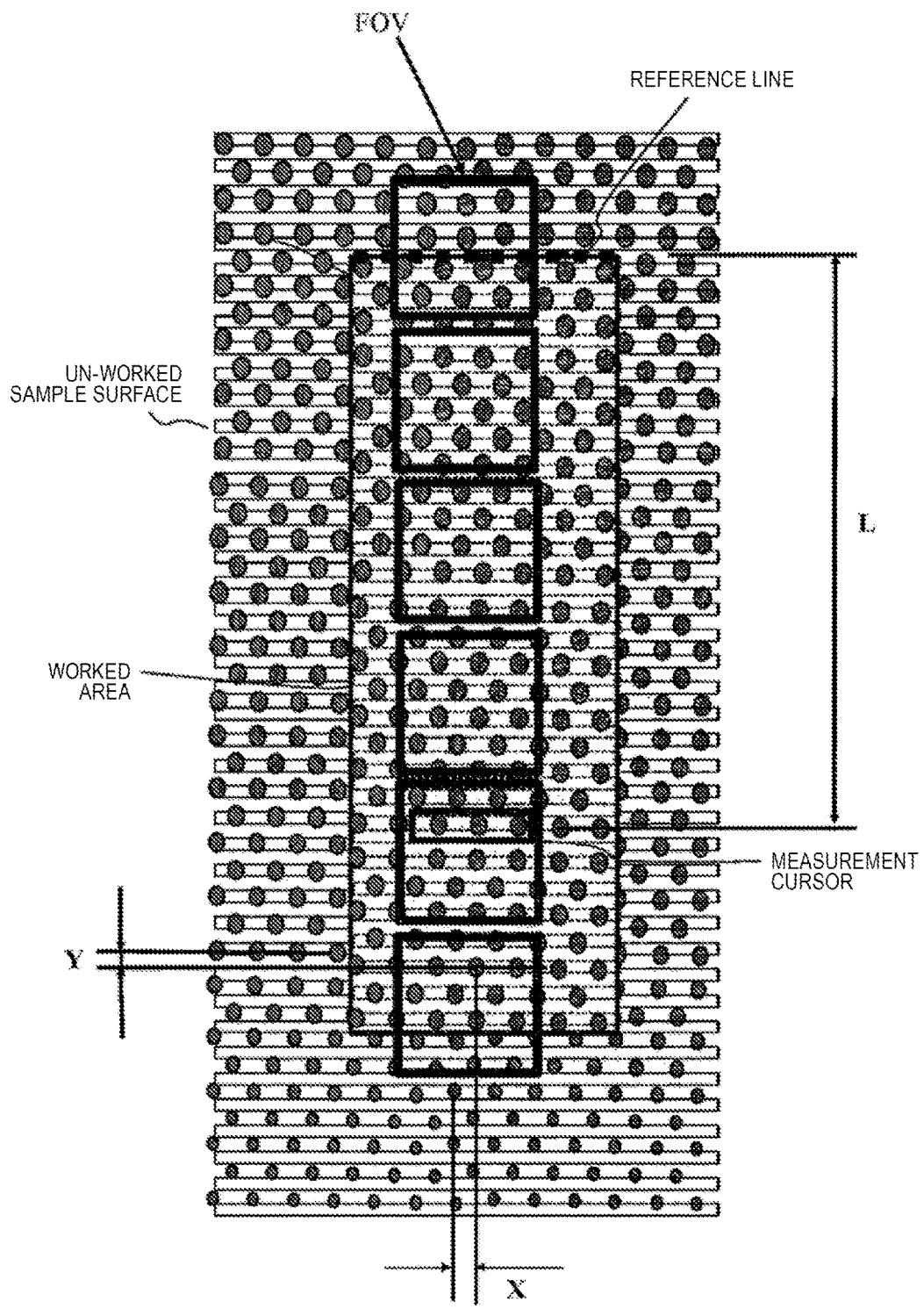

[Fig. 12]
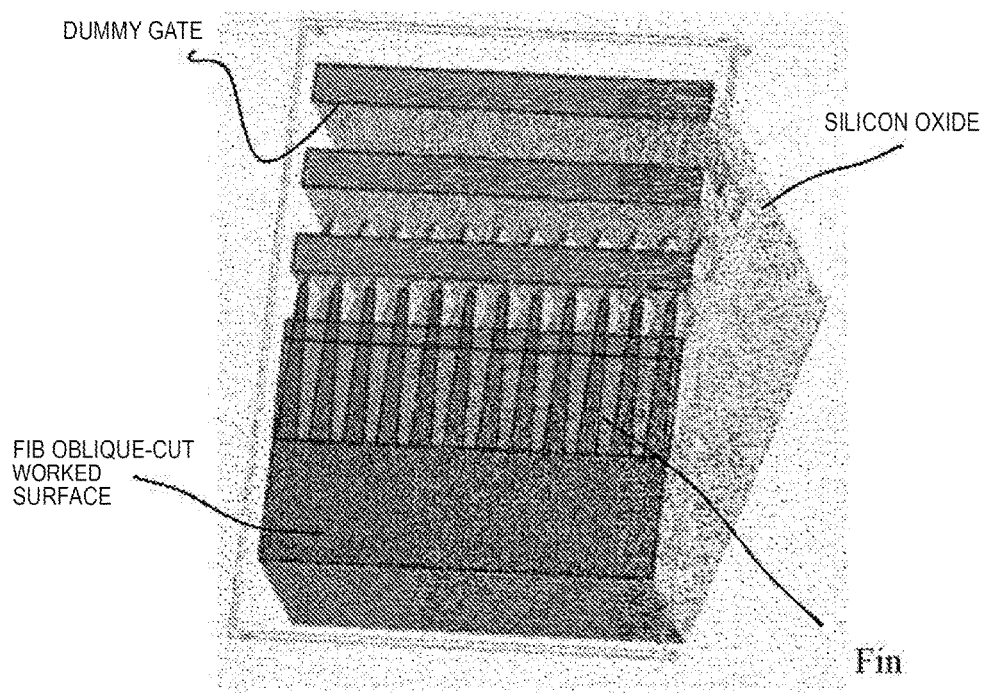

[Fig. 13]
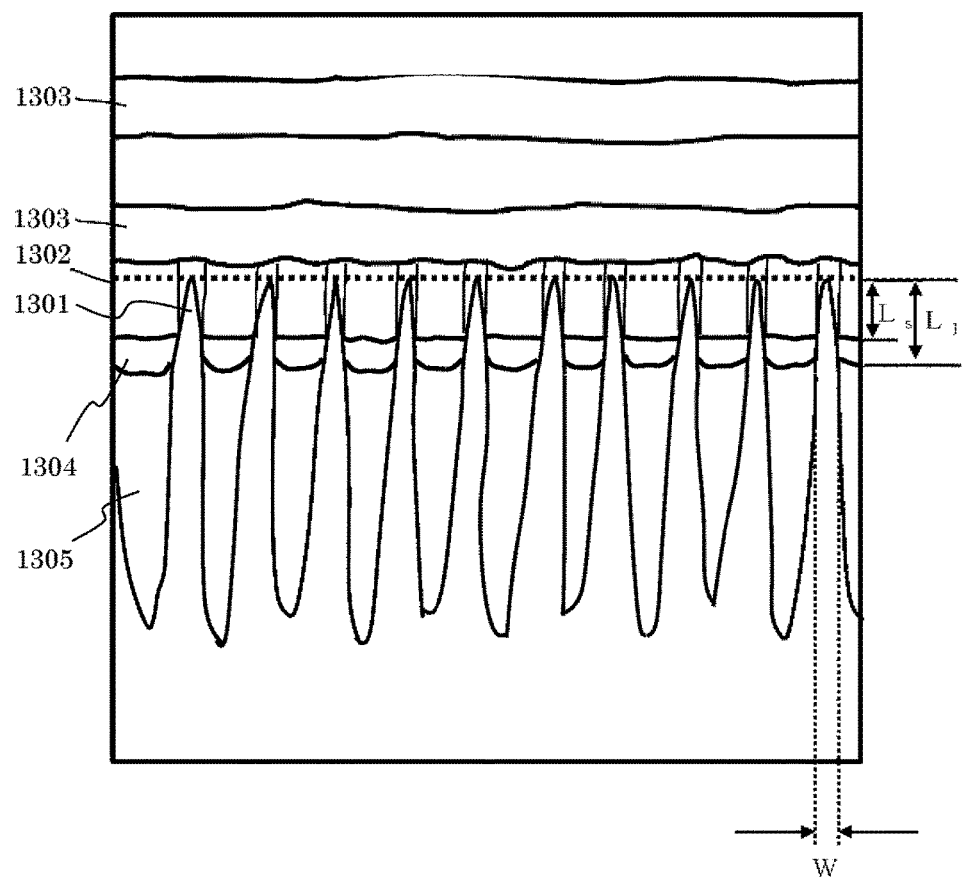

[Fig. 14]
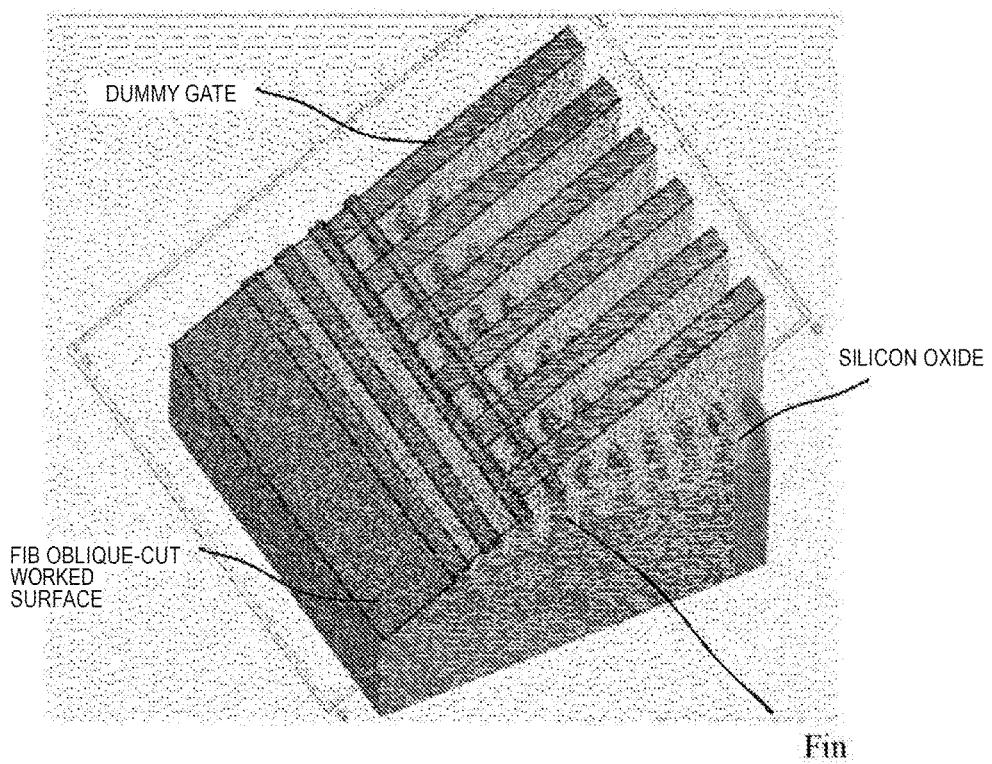

[Fig. 15]
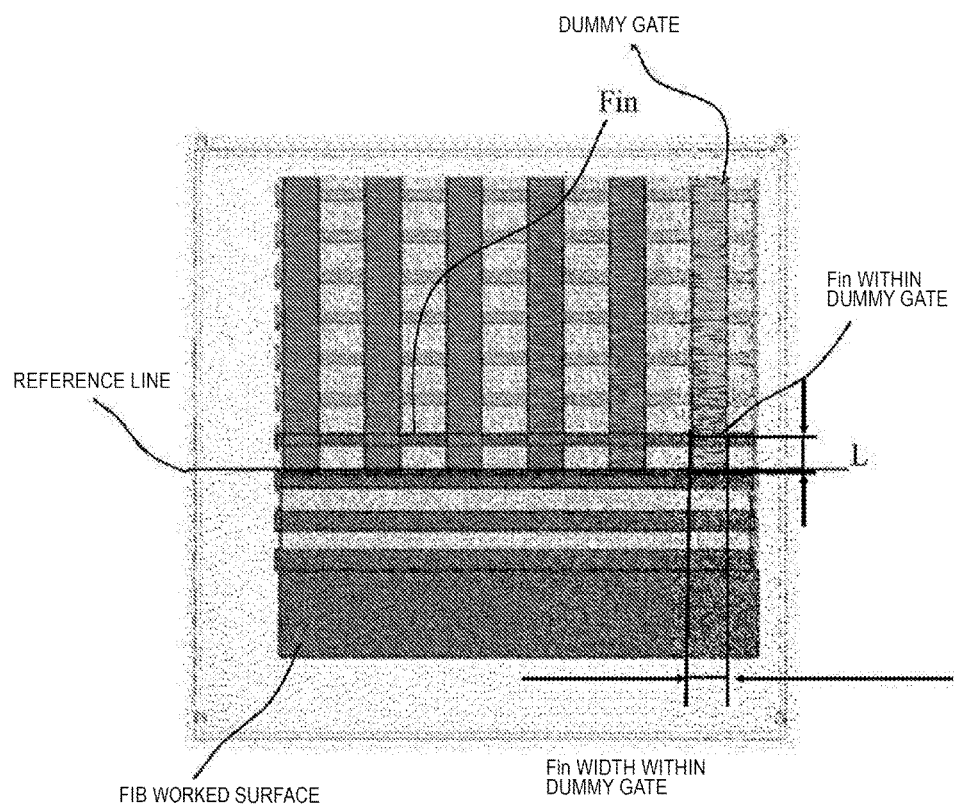

[Fig. 16]
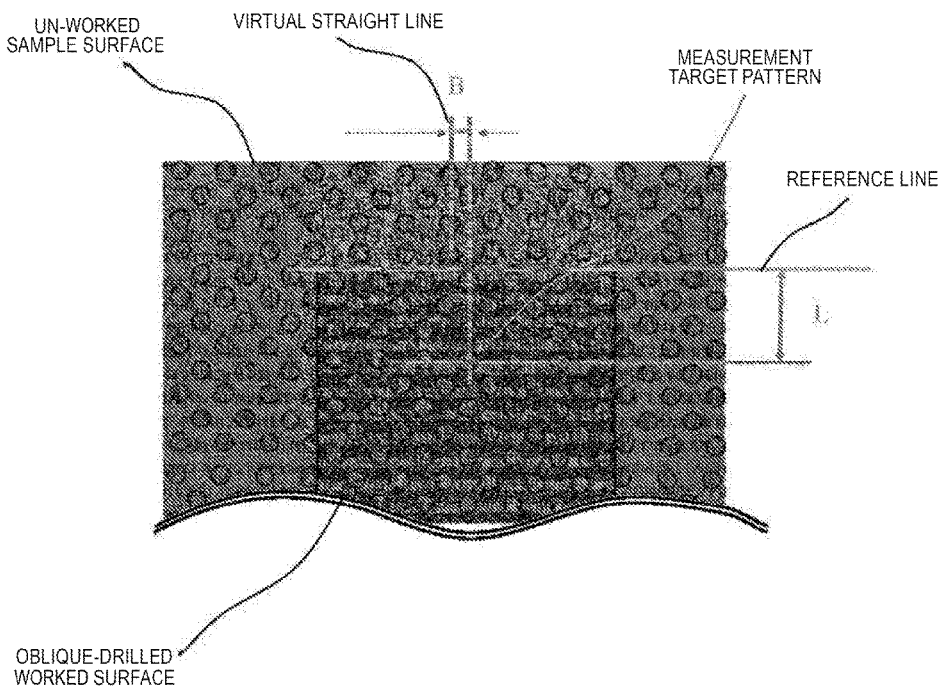

[Fig. 17]
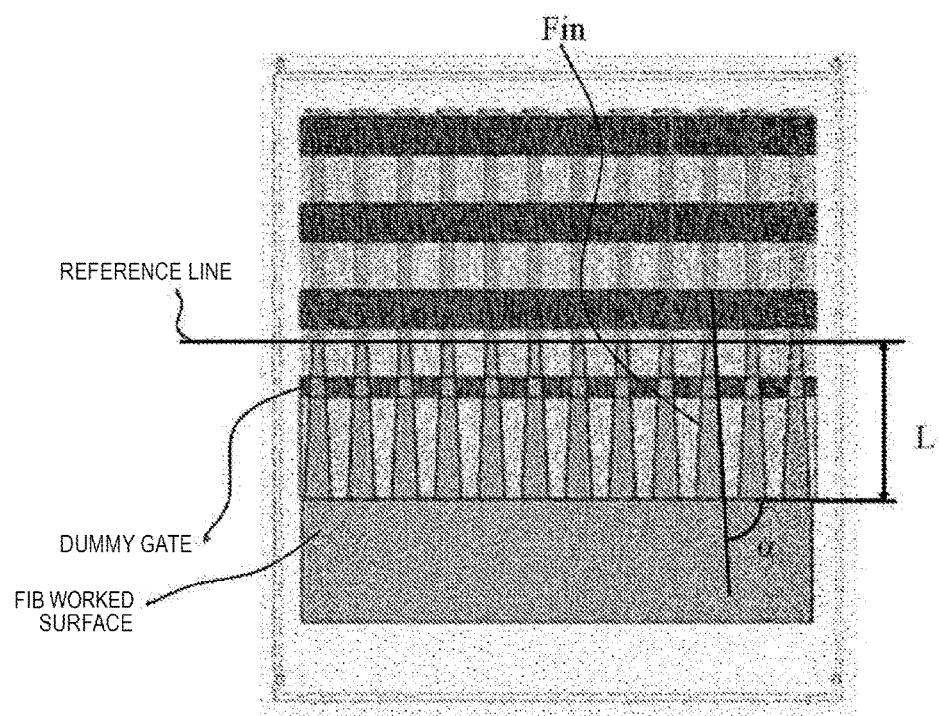

[Fig. 18]
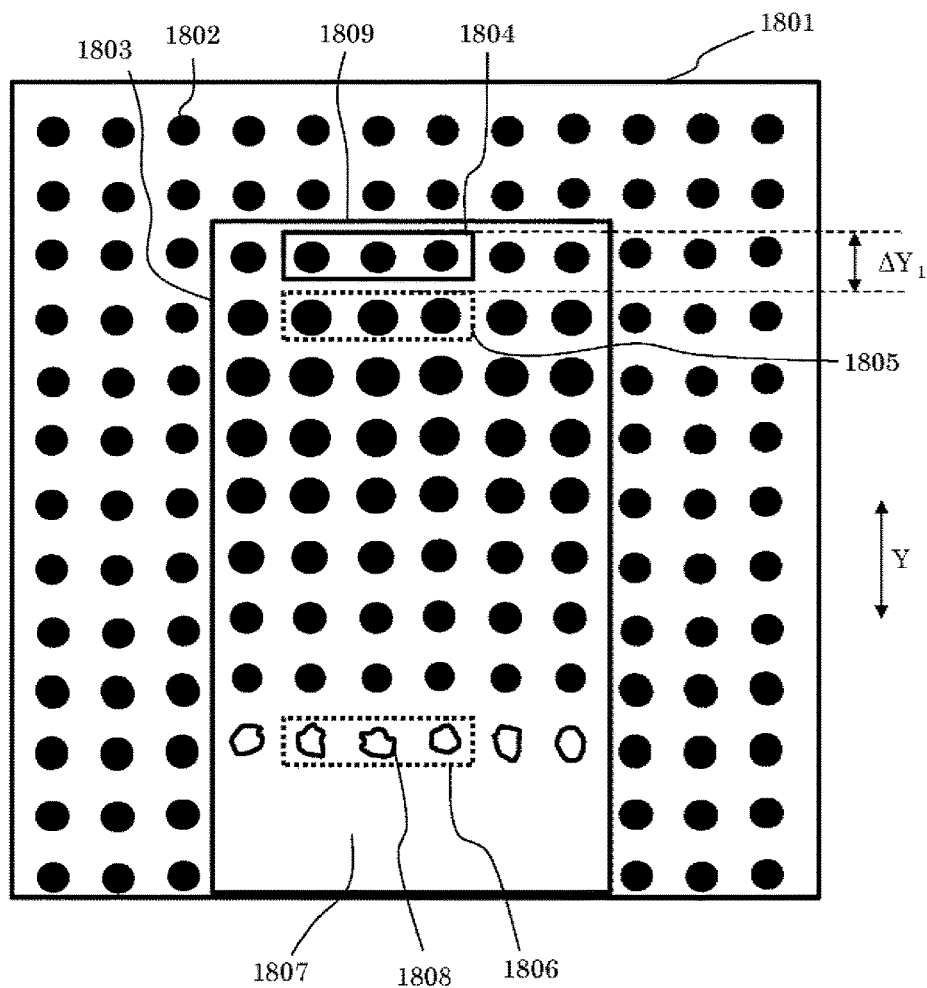

[Fig. 19]
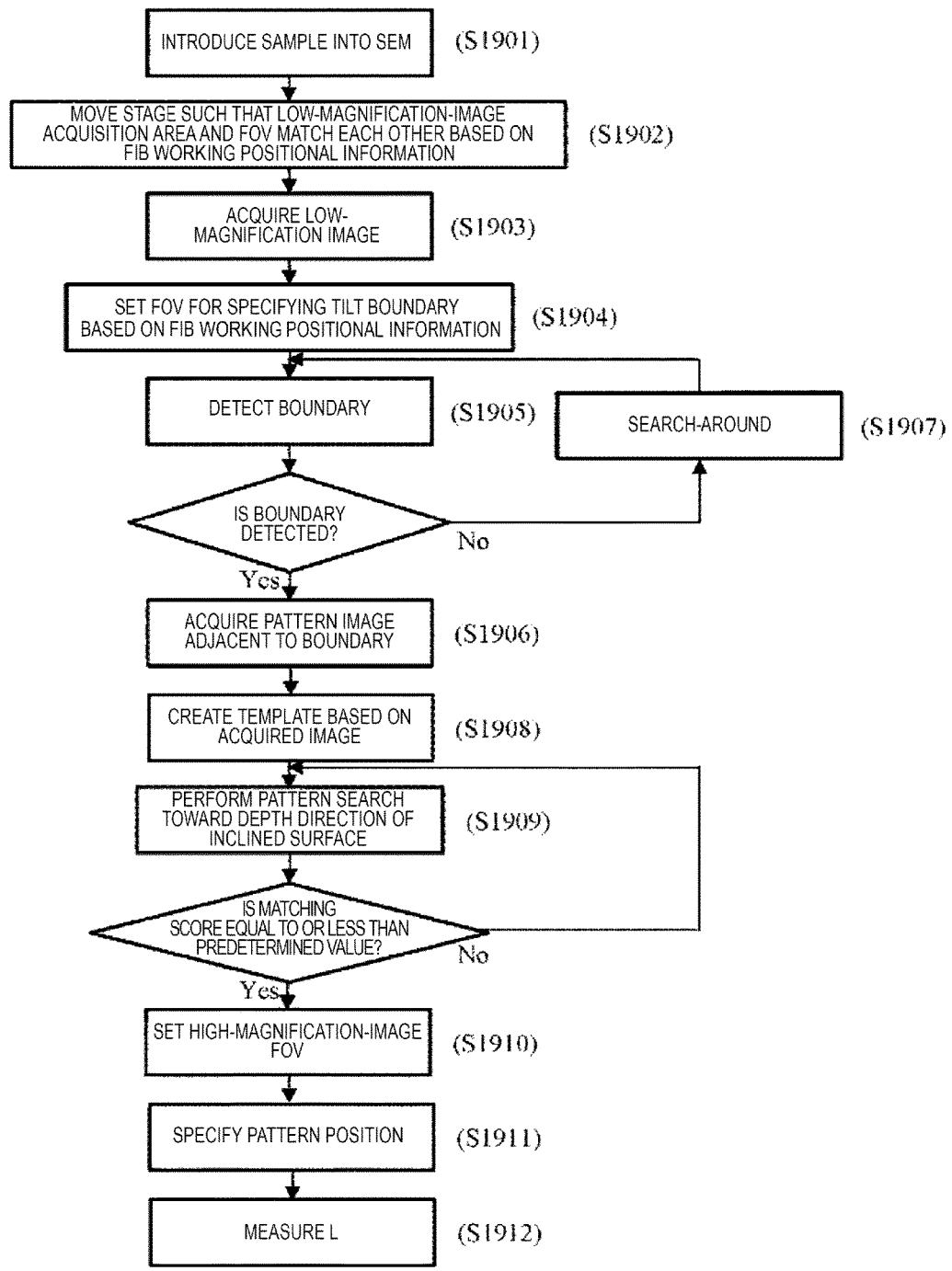

[Fig. 20]
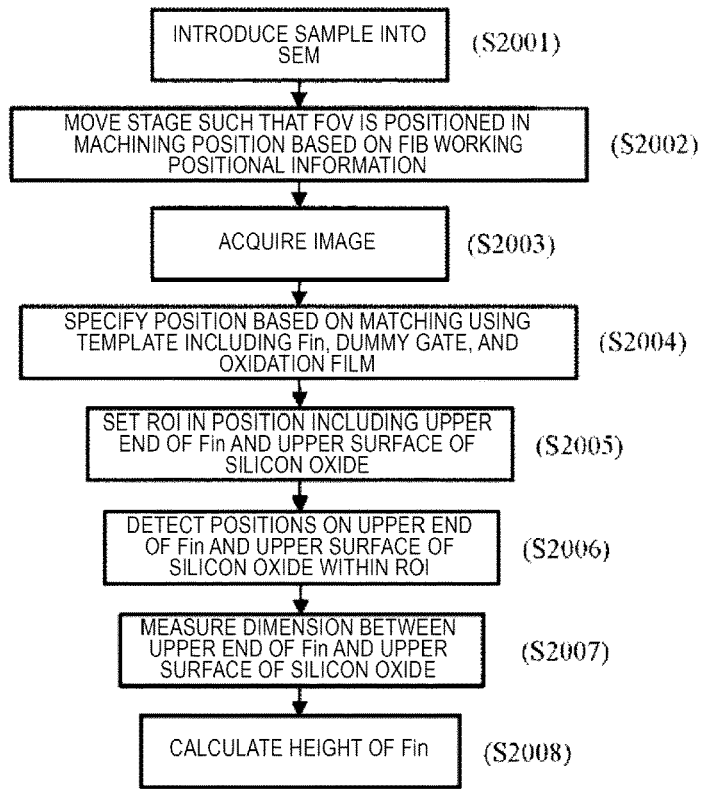
[Fig. 21]
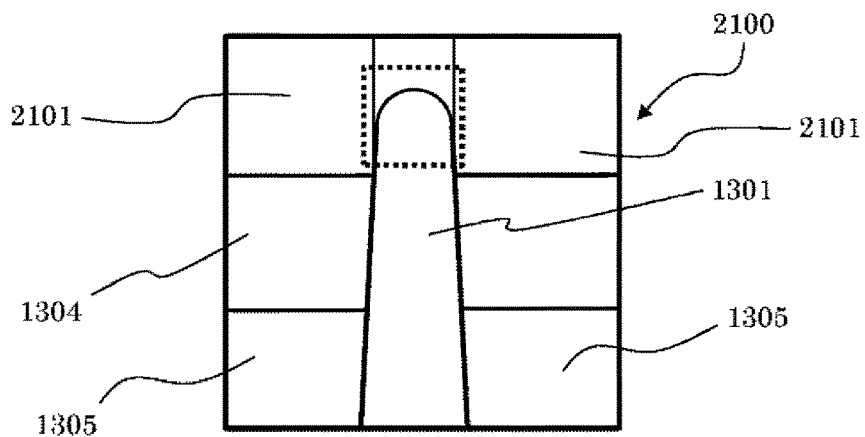

[Fig. 22]
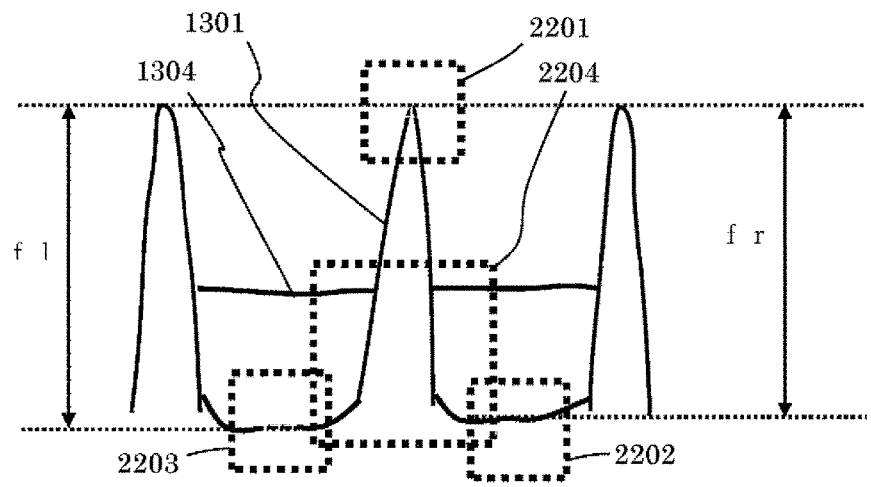
[Fig. 23]
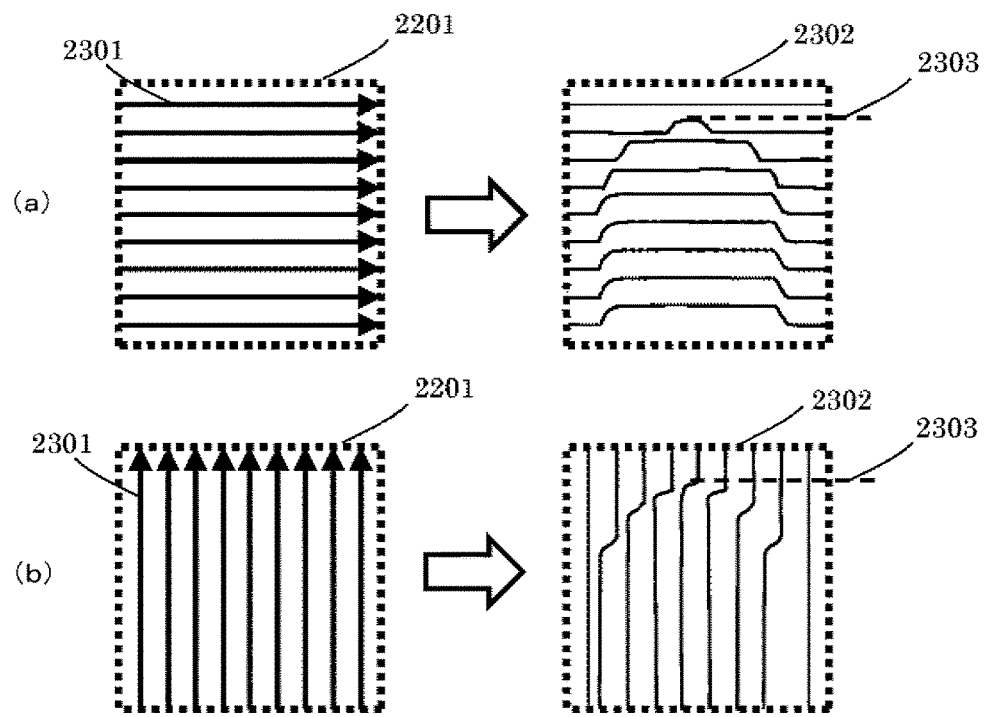

PATTERN MEASUREMENT METHOD AND PATTERN MEASUREMENT DEVICE

CROSS REFERENCE TO PRIOR APPLICATIONS

This application is a U.S. National Phase application under 35 U.S.C. § 371 of International Application No. PCT/JP2015/063412, filed on May 11, 2015, which claims benefit of priority to Japanese Application No. 2014-133502, filed on Jun. 30, 2014. The International Application was published in Japanese on Jan. 7, 2016 as WO 2016/002341 A1 under PCT Article 21 (2). The contents of the above applications are hereby incorporated by reference.

TECHNICAL FIELD

The presently disclosed subject matter relates to a pattern measurement method and a pattern measurement device, and particularly, to a pattern measurement method and a pattern measurement device capable of accurately measuring a pattern having a three-dimensional structure.

BACKGROUND ART

In recent processes of manufacturing semiconductor devices, semiconductor devices are being further miniaturized, and the importance of pattern dimension management for such processes has increased. Patterns are formed to have three-dimensional structure, and thus, a manufacturing method of integrating the pattern has been applied. In order to manage the dimension of the pattern having the three-dimensional structure, it is necessary to evaluate performance of the pattern in a sectional direction. In order to evaluate the section of the pattern, a sample is cut and the section of the pattern seen on a fracture surface is observed. A method is considered, given a surface on which a section of the sample is exposed in a longitudinal direction, by drilling the sample in a direction perpendicular to the sample surface without cutting the sample and evaluating the section thereof.

Patent literature 1 (PTL 1) describes a method in which a sample thickness t is calculated by forming a taper-shaped inclined surface using a focused ion beam (FIB), acquiring a surface observed image of the formed inclined surface by using an electron microscope, and calculating $2 \cdot X \cdot \tan \alpha$ based on an inclination angle $\alpha$ of the inclined surface.

CITATION LIST

Patent Literature

PTL 1: JP-A-2005-235495

SUMMARY OF INVENTION

Technical Problem

In recent years, semiconductor patterns need to have the miniaturized three-dimensional structure, and there is an increasing need for high-accuracy measurement of a depth, a shape, or a dimension in a height direction of the pattern in order to stabilize a working process thereof. For example, a contact hole for causing hierarchies of a device having a plurality of electrically continuous hierarchical structures has only a diameter on the order of a few dozen nanometers to cope with the miniaturization. Meanwhile, the number of hierarchies is increased in order to cope with integration improvement, and thus, the depth is increased up to thousands of nanometers. A Fin line pattern of a FinFET device having a three-dimensional structure has a sectional shape having a width of dozens of nanometers and a height of about several times greater than the width. Since this line pattern is a passage through which a switching current passes, it is necessary to manage a line width of the line with an accuracy of several nanometers in a height direction.

Meanwhile, in a mass-production process of the device, if the wafer is cut, since it is difficult to return the wafer to the subsequent process, the wafer is lost whenever the management is performed in the respective processes, and thus, yield is deteriorated.

In a case where the wafer is cut and the section of the pattern is observed, several hours have elapsed. Thus, even though an abnormality of the sectional shape is detected, it is difficult to enhance the process of the wafers manufactured in the mass-production line within several hours, and thus, the yield can be deteriorated.

Since a drilled volume is large in the method of drilling a hole in the direction perpendicular to the sample surface, the required time, including working time, is long, and thus, the yield can be deteriorated.

As described in PTL 1, if there is an attempt to acquire information of the sample in the height direction based on a scanning distance X of an electron line and an inclination angle $\alpha$ of the worked inclined surface, it is difficult to perform high-accuracy measurement. In a case where the scanning distance is calculated, if a start point (or an end point) thereof is not accurately ascertained, it is not expected that the high-accuracy measurement is performed, and a method of accurately calculating a point as a measurement reference is not described in PTL 1.

Hereinafter, a pattern measurement method and a pattern measurement device capable of measuring a pattern in a depth direction with high accuracy are suggested.

Solution to Problem

As an aspect for achieving the aforementioned object, there is provided a pattern measurement method of performing measurement of a pattern constituting a circuit element which includes a deep hole, a deep groove, or a three-dimensional structure formed on a sample, based on a detection signal acquired by a scanning electron microscope. The method includes: a step of forming an inclined surface in a sample area including the circuit element which includes the deep hole, the deep groove, or the three-dimensional structure by irradiating the sample area with a focused ion beam; a step of setting a field of view of the scanning electron microscope such that the field of view includes a boundary between the inclined surface and the sample surface, and acquiring an image of the field of view based on a detection signal acquired by scanning the field of view with an electron beam; a step of specifying a first position as a boundary between the inclined surface and a non-inclined surface by using the acquired image; a step of specifying a second position as a position of a desired deep hole or deep groove positioned within the inclined surface, a bottom of the deep hole or the deep groove, or a position on a surface of a layer crossing a pattern that includes the three-dimensional structure; and a step of calculating a dimension in the sample surface direction between the first position and the second position and a dimension of the pattern constituting the circuit element that includes the deep hole, the deep groove, or the three-dimensional structure in a height direction based on an angle of the inclined surface.

As a specific aspect for achieving the aforementioned object, there is provided a pattern measurement method of performing measurement of a circuit element that includes a fin-shaped pattern formed in a sample based on a detection signal acquired by a scanning electron microscope. The method includes: a step of forming an inclined surface in an area including the circuit element such that a section of the fin-shaped pattern is exposed on a surface by irradiating the area with a focused ion beam; a step of setting a field of view of the scanning electron microscope such that the field of view includes an upper end of the fin and an area on a layer of the sample lower than the upper end of the fin, and acquiring an image of the field of view based on a detection signal acquired by scanning the field of view with an electron beam; a step of specifying a first position at the upper end of the fin-shaped pattern by using the acquired image; a step of specifying a second position located on a lower layer of a sample than the upper end of the fin-shaped pattern; and a step of performing measurement of a dimension in the sample surface direction between the first position and the second position and a dimension of the fin-shaped pattern in a height direction based on an angle of the inclined surface.

As another aspect for achieving the aforementioned object, there is provided a pattern measurement device that measures a dimension of a pattern formed on a sample based on a detection signal acquired by a scanning electron microscope. The device includes: a calculation device that specifies a boundary between an inclined surface and a non-inclined surface formed on the sample based on a signal acquired by the scanning electron microscope, measures a dimension in the sample surface direction between the boundary and a pattern included in the image, and measures a dimension of the pattern in a height direction based on the dimension value and a relative angle between the inclined surface and a sample surface.

As another specific aspect for achieving the aforementioned object, there is provided a pattern measurement device that measures a dimension of a pattern formed on a sample based on a detection signal acquired by a scanning electron microscope. The device includes: a calculation device that specifies a position of an upper end of a fin-shaped pattern based on the signal acquired by the scanning electron microscope, specifies a position of a silicon oxide layer located on a layer lower than the fin-shaped pattern, and calculates a dimension of the fin-shaped pattern in a height direction based on the position of the upper end of the fin-shaped pattern, a dimension in the sample surface direction between the silicon oxide layer and the position, and an angle of an inclined surface formed on the sample.

Advantageous Effects of Presently Disclosed Subject Matter

According to the aforementioned configuration, it is possible to measure a pattern in a depth direction with high accuracy.

BRIEF DESCRIPTION OF DRAWINGS

FIG. 1 is a diagram showing an outline of a scanning electron microscope.

FIG. 2 is a diagram showing an outline of a focused ion beam.

FIG. 3 is a diagram showing an example of a measurement system including the scanning electron microscope and the focused ion beam.

FIG. 4 is a diagram showing an example of a graphical user interface (GUI) screen for setting a measurement condition for a worked area using a focused ion beam (FIB).

FIG. 5 is a diagram for describing a method for measuring a dimension between the center of gravity of a pattern and a tilt boundary.

FIG. 6 is a diagram for describing a method for measuring a dimension between the center of gravity of a pattern and a tilt boundary.

FIG. 7 is a diagram showing an example of a GUI screen used for setting the measurement condition.

FIG. 8 is a diagram showing an example of a sample on which oblique working has been performed using the focused ion beam.

FIG. 9 is a side view of a sample on which the oblique working has been performed using the focus ion beam.

FIG. 10 is a flowchart showing a process of acquiring depth information of the sample.

FIG. 11 is a diagram for describing an example in which a plurality of fields of view is set on an oblique-worked surface and an image is acquired.

FIG. 12 is a diagram showing a section structure of FinFET on which the oblique working has been performed using the focused ion beam.

FIG. 13 is a diagram showing an example of an image acquired by imaging the oblique-worked surface by an electron microscope after the oblique working is performed.

FIG. 14 is a diagram showing a section structure of a dummy gate on which FIB oblique cutting has been performed.

FIG. 15 is a diagram showing an example in which a width of a line within the dummy gate is measured.

FIG. 16 is a diagram for describing a measurement method of measuring a depth of a deep hole up to a bent portion.

FIG. 17 is a diagram showing a measurement example of a sidewall angle of the Fin.

FIG. 18 is a diagram showing an example of a low-magnification image including an oblique-worked area.

FIG. 19 is a flowchart showing a process of automatically performing depth measurement.

FIG. 20 is a flowchart showing a process of automatically performing Fin height measurement.

FIG. 21 is a diagram showing an example of a template used in position adjustment when the Fin height measurement is performed.

FIG. 22 is a diagram for describing an example in which an area as a measurement reference is automatically set when the Fin height measurement is performed.

FIG. 23 is a diagram for describing a method of automatically specifying a Fin apex.

DESCRIPTION OF EMBODIMENTS

An embodiment to be described below relates to a method and a device for measuring a height by primarily using an electron microscope. If there is an attempt to measure semiconductor devices that are being miniaturized using means other than the electron microscope, the throughput or measurement accuracy is deteriorated and device management cost is increased in a mass-production plant of the devices. Thus, a means other than an electron microscope is not suitable for mass production. Hereinafter, a method and a device for realizing measurement at favorable measurement accuracy and device management cost without remodeling the electron microscope will be described.

An embodiment as described below provides a method and a device for acquiring information of a depth direction by forming an inclined surface that obliquely descends from a sample surface in an area including a portion in which there is a pattern as a measurement target; measuring a distance between a pattern exposed on a worked surface and a start position of the descended inclined surface; and calculating a distance between the sample surface and the pattern in a depth direction (Z direction in a case where a direction of an un-worked sample surface is an X-Y direction) from the distance between the start position of the descended inclined surface and the pattern in the X-Y direction.

According to an embodiment to be described below, it is possible to measure a dimension of the pattern in the depth direction or a change in pattern shape depending on a change in position in the depth direction without cutting a wafer. In a measurement method of evaluating a section of a cut wafer, where the pattern is bent in a direction perpendicular to a fracture surface, it is difficult to quantitatively measure a bent direction or a shifted amount. That is, in a case where the sectional shape of the pattern seen on the fracture surface becomes smaller as it becomes deeper from a wafer surface, it is difficult to recognize whether or not the pattern is actually thinned or whether or not the sectional shape of the pattern is apparently small since the pattern is bent in the direction perpendicular to the fracture surface and a center thereof is shifted. In contrast, according to an embodiment, since the bending of the pattern in the depth direction is measured as position shift of the pattern exposed on a drilled section, it is possible to measure the bending of the pattern independently of the change of the section shape.

A present embodiment provides a pattern measurement method and a pattern measurement device capable of performing pattern measurement in a depth direction with high accuracy based on a high-magnification image.

As an aspect for measuring a deep hole or a deep groove with high accuracy by using a high-magnification image, there is provided a pattern measurement method of performing pattern measurement based on a detection signal acquired by a scanning electron microscope (SEM). The method includes a step of irradiating a worked area with a focused ion beam such that the worked area includes a pattern as a measurement target or an edge and an inclined surface is formed in the worked area; a step of setting the fields of view (FOV) of the scanning electron microscope in at least two areas, that is, the pattern as the measurement target or a first portion of the pattern and a tilt boundary between the inclined surface and the sample surface or a second portion of the pattern, and acquiring detection signals, measuring a dimension in the sample surface direction based on the detection signals acquired from the fields of view of the at least two areas or positions; and a step of calculating a dimension in the sample surface direction, and a dimension between the pattern as the measurement target or the first portion and the tilt boundary or the second portion based on an angle of the inclined surface. In certain embodiments, the deep hole is a contact hole formed on a semiconductor wafer. In some embodiments, the second portion or second position is a pattern portion indicating a bottom of the contact hole, a center position of gravity of the contact hole, or a position in which the contact hole is displaced in a direction perpendicular to the depth direction of the contact hole. In other embodiments, measurement of a circuit element includes a fin-shaped pattern formed in a sample based on a detection signal acquired by a scanning electron microscope.

There is provided a pattern measurement device that measures a dimension of a pattern formed on a sample based on a detection signal acquired by a scanning electron microscope. The device includes an input device that sets a first field of view less than a field of view of the first image, a second field of view which is a position different from the first field of view and is less than the first field of view, and a measurement cursor which extracts at least one of a first portion and a second portion which is within at least one of the first field of view and the second field of view and serves as a measurement reference of the pattern on a first image acquired by the scanning electron scope, and a calculation device that specifies the first portion of the pattern within the measurement cursor of the first field of view set by the input device, specifies a boundary between the sample surface and the inclined surface within the second field of view or the second portion of the pattern within the measurement cursor set within the second field of view, and measures a dimension between the first portion and the boundary or the second portion. In some embodiments, a calculation device can specify a boundary between an inclined surface and a non-inclined surface formed on the sample based on a signal acquired by the scanning electron microscope, measure a dimension in the sample surface direction between the boundary and a pattern included in the image, and measure a dimension of the pattern in a height direction based on the dimension value and a relative angle between the inclined surface and a sample surface.

The method and the device for acquiring the information of the depth direction will be described in more detail with reference to the accompanying drawings.

FIG. 8 is a diagram showing a sample acquired by working a sample surface by using FIB, and is particularly a diagram showing an example of a sample worked such that an inclined surface in a direction crossing a sample surface direction (X-Y direction) is formed on the sample. In the example of FIG. 8, a portion in which deep hole patterns crowd is obliquely drilled. Ion beams are obliquely incident on the sample surface toward the left from the right of this diagram, and thus, the sample surface is obliquely drilled. As a result, the inclined surface is formed so as to descend toward the left from the right of this diagram. Meanwhile, since the deep hole patterns are drilled in a vertical direction perpendicular to the sample surface, the sections of the deep hole patterns are exposed from the inclined surface until the inclined surface reaches the depths of hole bottoms of the patterns.

FIG. 9 is a side view of the sample having the inclined surface formed thereon. The ion beams are incident from the upper right, and a worked surface that descends from the right toward the left is formed. A position where the sample surface and the worked surface cross each other is a drilling start point. The ion beams move straight through this position, and thus, the worked surface that descends toward the lower left is formed. In the example of FIG. 9, an angle formed by the ion beams and the sample surface, that is, a descent angle of the worked surface is 40°.

If this inclined surface is observed in a Z direction, it is possible to observe the sections of layers layered in the Z direction. Since the worked surface is an inclined surface that descends from an un-worked sample surface, as the inclined surface descends, the sections of the deep holes equivalent to deeper portions are exposed. That is, the sectional shapes of the deep hole patterns cut in position having various depths can be seen on the worked surface. In FIG. 9, the depth of the section located in a position which is 4 μm apart from the drilling start point toward the left is 3.4 μm.

Meanwhile, an SEM (critical dimension-SEM: CD-SEM) having a function of measuring the dimension of a pattern needs to have high resolution in order to measure the dimension of a fine pattern with high accuracy. In order to achieve high resolution, a distance (working distance) between the sample surface and an objective lens needs to be reduced, and thus, it is actually difficult to incline a large sample such as a wafer in a limited space. Hereinafter, a method for acquiring information of a height direction (Z direction) by irradiating the sample surface with beams in a direction perpendicular to the sample surface, and a device for realizing this method, is described.

In the present embodiment, after working to form an inclined surface using FIB is performed, information of an oblique-worked surface is acquired by detecting a signal acquired by irradiating the sample surface with beams in a direction which is perpendicular to a sample surface (a sample surface in an un-worked area in FIG. 9) and crosses the oblique-worked surface. The pattern as the measurement target or the sectional shape is exposed on the oblique-worked surface, and the positions thereof can be ascertained by acquiring an image using the CD-SEM. In a case where a distance to the pattern as the measurement target or the sectional shape from a boundary (drilling start point) between the oblique-worked surface and the sample surface is L, a depth (distance from the sample surface) D of the pattern or the sectional shape can be expressed by Expression 1.

$$D = L \times \tan \theta \qquad \text{[Expression 1]}$$

FIG. 10 is a flowchart illustrating detailed processes of acquiring depth information based on the above-calculation expression. The oblique-worked surface illustrated in FIGS. 8 and 9 is previously formed using FIB, and working information thereof (working position or inclination angle (irradiation direction of ion beams)) is acquired. A wafer having an oblique-worked surface formed thereon is disposed at a stage of the SEM, and the wafer stage is moved such that an FIB worked portion is within a field of view with a low magnification of the electron microscope (step 1) based on the working information. As stated above, since coordinate data (working positional information) of the FIB worked portion is transmitted from an FIB working device, the worked portion can be within the field of view of the SEM with a magnification of about 3000 times. In this case, since brightness or contrast of the FIB worked portion is obviously different from that of an un-worked portion therearound, the stage position or the movement of the field of view (beam shifting) is automatically performed such that the worked portion is within the center of the field of view of the SEM by using an automatic identification function of the image, and thus, the worked portion can be within the center of the field of view even though the field of view is narrowed in the subsequent high-magnification measurement.

Subsequently, the oblique-drilled portion is imaged by combining a plurality of SEM images (step 2). An example thereof will be shown in FIG. 11. Since an area in which the section of the pattern as the measurement target is exposed on a surface in which the hole is obliquely drilled using FIB becomes longer as the patterns become deeper, the entire area is not pictured on one SEM image in some cases.

For example, if the crowded deep holes are observed with a magnification of 300,000 times in order to measure the deep hole patterns having a 20 nm node or less, where the size of a display area is 13.5 cm angle, only a square area having 450 nm angle is captured on the SEM image. Meanwhile, if the depth of the hole is about 3.4 μm, a length between a portion having a depth of 3.4 μm and the boundary between the oblique-worked surface and the sample surface in the sample surface direction is 4 μm. Thus, in order to image the entire area with a magnification of 300,000 times, at least nine SEM images are required. In a case where the coupled images are acquired, it is necessary to image the entire area while gradually shifting the field of view. Here, since the worked surface which is a descent inclined surface descends as the field of view is shifted, it is necessary to adjust a focus when the SEM is acquired for each area. Thus, the device can have a function of recording the movement amount of the field of view from a reference using a position of the field of view including a reference line as the reference and modifying a focus position downwards as many as a depth D acquired when the movement amount of the field of view is L in Expression 1. By doing this, since the focus can be rapidly adjusted with accuracy, it is possible to more accurately acquire the measurement value at a high speed.

Subsequently, the reference line (drilling start line) of FIG. 11 is specified, and the pattern of which the depth will be measured is selected (step 3). In this case, in a case where there is a plurality of patterns located so as to be equidistant from the reference line, an area including the plurality of patterns is selected as the measurement target. In the example of FIG. 11, three patterns are selected. In a case where the depth of the selected pattern is measured, the position of the pattern within a cursor is measured for each pattern within the cursor by performing, for example, a process of acquiring relative positions of the pattern and the cursor. In a case where contrast between the pattern and a surrounding area thereof is high, a measurement reference position can be extracted by acquiring the center of gravity of an area recognized as the pattern by performing binarization. In a case where the depth of the hole is measured, the measurement reference position can be extracted by performing image processing for automatically recognizing the hole bottom.

Subsequently, a dimension between the specified reference line and the center of gravity (the center) of the pattern which is extracted is measured, and the depth D is acquired based on Expression 1 (steps 4 and 5). In some embodiments, a calculation device can specify a center of gravity of a pattern, and measure a dimension between the center of gravity and a boundary. According to the aforementioned measurement method, even though the depth of the deep hole is measured, the high-accuracy measurement can be performed based on the high-magnification image. If the depth of the deep hole is about 3 μm, a distance between a position in which the hole bottom is seen on the FIB worked surface and the reference line is about 4 μm. If a hole diameter is about 30 nm, a magnification of the SEM image needs to be about 200,000 times or more in order to measure this dimension, and since the field of view of this SEM image is about 0.7 μm, the reference line is not pictured within the SEM image on which the hole bottom has been pictured. As stated above, the depth of the deep hole can be measured with high accuracy by acquiring the image using a high-magnification image from the tilt boundary and the measurement target.

Hereinafter, the reference line (tilt boundary) as a measurement reference point will be described. The reference line is a line in which a surface as a reference when the depth of the pattern section exposed on an FIB oblique-drilled surface is calculated and the oblique-drilled surface cross each other in a case where the crowded deep holes are measured. For example, in a case where the crowded deep holes are measured, the wafer surface is a reference surface, and a line in which the wafer surface starts to be obliquely drilled using FIB is the reference line. In this case, the depth of the hole pattern exposed on the oblique-drilled surface is a depth when the wafer surface is used as the reference. In order to specify the reference line on the SEM image, a line in which a carbon protective film formed on the sample surface starts to be cut by the FIB working needs to be found before the FIB working is started. Thus, a contrast difference between a portion of the carbon protective film and a drilled inclined portion needs to be found on the SEM image, and a boundary line thereof needs to be determined as the reference line.

The details of the pattern measurement device capable of performing the aforementioned measurement will be described below. FIG. 1 is a diagram showing an outline of an SEM 100. An electron beam 103 which is extracted from an electron source 101 by an extracting electrode 102 and is accelerated by a non-illustrated acceleration electrode is narrowed by a condenser lens 104 which is one type of a focusing lens, and is one-dimensionally or two-dimensionally scanned on a sample 109 by a scanning detector 105. The electron beam 103 is decelerated by a negative voltage applied to the electrode built in a sample stage 108, and is focused by a lens action of an objective lens 106. Thus, the sample 109 is irradiated with the electron beam.

If the sample 109 is irradiated with the electron beam 103, electrons 110 such as secondary electrons and backscattered electrons are emitted from the irradiation portion. The emitted electrons 110 are accelerated in an electron source direction by an acceleration action based on the negative voltage applied to the sample, and collide with a conversion electrode 112. Thus, secondary electrons 111 are generated. The secondary electrons 111 emitted from the conversion electrode 112 are trapped by a detector 113, and an output of the detector 113 is changed depending on the amount of captured secondary electrons. Luminance of a non-illustrated display device is changed depending on this output. For example, in a case where a two-dimensional image is formed, an image of a scanning area is formed by synchronizing a deflection signal to the scanning detector 105 and the output of the detector 113. The scanning electron microscope illustrated in FIG. 1 includes a deflector (not shown) that moves on a scanning area of the electron beam. This deflector is used for forming an image of patterns which are present in different positions and have the same shape. This deflector is called an image shift deflector, and allows the position of the field of view of the electron microscope to be moved without the movement of the sample using the sample stage. The image shift deflector and the scanning deflector can be used as a common deflector, an image shift signal can be superimposed on a scanning signal, and the superimposed signals can be supplied to the deflector.

Although it has been described in the example of FIG. 1 that the electrons emitted from the sample are once converted using the conversion electrode and are detected, the presently disclosed subject matter is not limited to such a configuration, and a detection surface of the detector or an electron multiplier can be formed in, for example, an orbit of the accelerated electrons.

A control device 120 controls the respective components of the scanning electron microscope, and has a function of forming an image based on the detected electrons or a function of measuring a pattern width of the pattern formed on the sample based on an intensity distribution of the detected electrons, which is called a line profile.

FIG. 2 is a diagram showing an outline of an FIB device 200. This device includes a liquid metal ion source 201 that emits desired ions, an extracting electrode 202 that extracts the ions from the liquid metal ion source 201, an aperture 204 that causes only the central portion of emission ions 203 to pass toward a downstream, a focusing lens 205 that controls the spreading of the emitted ions, a blanker 207 that shifts the orbit of the ion beam such that the ion beam does not temporarily reach a front surface of a sample 206, a diaphragm 208 that adjusts a beam current and a beam diameter, an aligner 209 that corrects the orbit of the ion beam on an optical axis, a deflector 210 that scans and sweeps the sample surface with the ion beam, an objective lens 211 that focuses the ion beam on the sample surface, a sample stage 212, and a secondary electron detector 214 that traps the secondary electrons emitted when a focused ion beam 213 is incident on the front surface of the sample 206.

A control device 215 that controls the respective components is further provided. The control device 215 performs working for forming a hole in a desired area by irradiating a predetermined working position with the ion beam 213 of which the current is adjusted by the diaphragm 208 and scanning the working position with the ion beam 213 by the deflector 210. The sample stage 212 includes a non-illustrated movement mechanism, and allows the sample 206 to move in the X-Y direction (when the irradiation direction of the ion beam is a Z direction) and the Z direction and to perform an operation such as tilting or rotation. The oblique working illustrated in FIG. 8 is performed by obliquely irradiating the sample surface with the beam.

FIG. 3 is a diagram showing an example of a measurement system including the SEM 100 and the FIB device 200. The system illustrated in FIG. 3 includes the SEM 100, the FIB device 200, a calculation processing device 301, and a design data storage medium 302. The calculation processing device 301 includes a calculation processing unit 304 that supplies a control signal including a measurement condition or a working condition to the SEM 100 or the FIB device 200 and performs a process related to the measurement of the pattern based on the detection signal or the measurement result acquired by the SEM 100, and a memory 305 that stores a recipe which is an operation program for determining the measurement condition or the working condition or the measurement result. The detection signal acquired by the SEM 100 is supplied to image processing hardware such as CPU, ASIC, or FPGA built in the calculation processing device 301, and image processing is performed on the detection signal according to the purpose.

The calculation processing unit 304 includes a working condition setting unit 306 that sets the working condition of the FIB 200, a measurement condition setting unit 307 that sets the measurement condition using the SEM 100, an area setting unit 308 that sets an image acquisition area or a measurement box, a measurement execution unit 309 that performs the measurement based on the detection signal acquired by the SEM 100, and a height calculation unit 310 that calculates a height of the pattern based on the previously stored calculation expression such as Expression 1 in the memory 305. The working condition or the measurement condition can be set by an input device 303, and a recipe for working or measurement is generated based on the setting.

In the memory 305, coordinate information of the set working position is stored as the measurement condition of the SEM 100 and information of an incident angle of the ion beam is stored as information used by the height calculation unit 310 for calculating a height (depth).

FIG. 4 is an example of a diagram showing a GUI screen for setting the measurement condition in the worked area using FIB. The GUI screen illustrated in FIG. 4 is displayed on, for example, a display device of the input device 303, and the calculation processing unit 301 creates a recipe which is an operation program that controls the SEM 100 by performing the setting using the GUI screen, and transmits the program to the control device 120 that controls the SEM. The GUI screen illustrated in FIG. 4 includes an SEM image display area 402 in which the SEM image is displayed and an area on the SEM image is able to be set using a cursor 401, and a measurement target setting area 403 (Target Definition) in which the measurement target is numerically defined. Within the SEM image display area 402, a position or a size of an acquisition area 406 (Sub Target) of the high-magnification image is able to set by a pointing device in an area (area in which an entire worked area 404 using FIB is displayed) 405 in which a target screen is displayed. Within the area 406, a measurement box 407 for extracting the measurement reference position (measurement start point or measurement end point) is able to be set. The operation recipe created by setting the area 406 or the measurement box 407 is used for controlling the SEM 100, and is an image acquisition condition displayed on a high-magnification-image display area 408 (Sub Target).

The measurement box is also referred to as a measurement cursor, and is used for selectively specifying a measurement reference within this area. In the measurement target setting area 403, the image acquisition condition or the measurement condition is able to be set without using the pointing device. The measurement target setting area 403 is primarily divided into three areas, that is, a setting area 409 for setting the image acquisition condition of the target, a setting area 410 for setting the acquisition condition of the high-magnification image, and a setting area 411 for setting the measurement condition. Height measurement (Height Measurement) which is one of measurement purposes (Category) in the present embodiment is selected on a window for inputting a category of the setting area 409. Setting items of the setting areas 410 and 411 are changed depending on the input of the measurement purpose. As mentioned above, in the case of the height measurement, since the measurement start point and the measurement endpoint are greatly distant from each other, if there is an attempt to allow the measurement start point and the measurement end point to be within one field of view, it is difficult to perform high-magnification observation. Thus, the setting items of the setting area 410 are provided such that a plurality of acquisition conditions of the high-magnification image is able to be set. At least two high-magnification acquisition areas (Sub Targets 1 and 2) are able to be set in the setting area 410. Although not shown, the size (FOV size) of the field of view (Field Of View) can be able to be set. A processing condition within the measurement box 407 depending on the measurement purpose is able to be set in the setting area 411. On the GUI screen illustrated in FIG. 4, the depth (Hole Depth) of the hole is set as the setting item in the height measurement.

As stated above, in a case where the depth of the hole is measured, it is necessary to use a working start point (a boundary between the sample surface and an FIB worked area) using FIB as a reference, whereas it is necessary to use the measurement reference close to the deep hole bottom as the center (center of gravity) of the hole. As mentioned above, in a case where the height measurement is performed, since the processing content for determining the measurement reference is changed between the measurement start point and the measurement end point, the processing content can be preferably set at each point. In the example of FIG. 4, setting for extracting a center position of gravity (Gravity point) 413 within a measurement box 412 is performed in Sub Target 1, whereas setting for extracting a tilt boundary (Tilt boundary) 415 within the measurement box 414 is performed in Sub Target 2. It is necessary to acquire the center position of gravity by recognizing the pattern within the measurement box 412, whereas it is necessary to extract the tilt boundary irrespective of the position of the pattern in the measurement box 414. The processing content within the measurement box can be changed depending on the measurement purpose in this manner, and thus, it is possible to perform the measurement in the height direction with accuracy.

As the method of extracting the center of gravity of the pattern, various methods are considered. For example, it is considered that a contour line of the pattern is extracted based on the pattern recognition and the center position of gravity is acquired based on a distance image of the contour line. As the method of extracting the tilt boundary, a method of determining both boundaries depending on a luminance difference by using a phenomenon in which the luminance of an inclined surface is higher than that of a planar surface by an edge effect is considered. For example, a waveform profile indicating a change in luminance of the measurement box 414 in the X direction can be acquired, and a position in which the luminance is changed can be specified. In a case where the tilt boundary is extracted, since there is a possibility that accurate boundary extraction will be obstructed due to the presence of the hole pattern, a process of causing a pixel value to match a pixel value of a background which does not include the pattern or is adjacent to the pattern based on the pattern recognition or a process of extracting a structure having periodicity can be performed. Unlike the plurality of arranged hole patterns, since the tilt boundary is easily performed by image processing, the tilt boundary can be specified without performing the setting of the measurement cursor 406.

As illustrated in FIG. 4, it is possible to set the tilt boundary and the measurement target pattern for a low-magnification image, and it is possible to easily realize desired height (depth) measurement of the pattern. The position of Sub target 2 can not be set on the GUI screen, and can be automatically set based on the working positional information supplied to the FIB device 200. A point (a boundary between the inclined surface and the sample surface) at which brightness is changed can be automatically searched within Sub target 2 without setting the measurement box. In the specification of the brightness change point, it is considered that the change point is calculated by creating a luminance profile in the X direction and performing differential calculus on the luminance profile.

FIG. 5 is a diagram for describing a method of measuring a dimension between center positions of gravity 413 within two sub targets 501 and 502 and a tilt boundary 415. In the present example, images of two sub targets 501 and 502 are acquired, and the positions of the center position of gravity 413 and the tilt boundary 415 are specified within the measurement boxes 412 and 414 which are respectively set thereto, and distances ($\Delta x_b$ and $\Delta x_s$) between the acquired positions and the centers of the measurement boxes. Subsequently, the movement amounts (the deflection amounts of the beam) $\Delta x$, $\Delta x_b$, and $\Delta x_s$ of the field of view between the sub target 501 and the sub target 502 are calculated, and thus, it is possible to accurately calculate the distance between the working start point and the measurement target pattern.

$\Delta x$ is a value in proportional to the amount of signals supplied to the deflector when the image shifting is performed, and is previously stored in the memory 305. According to such a method, it is possible to accurately measure the distance between the tilting start point and the measurement target pattern located on the inclined surface in the sample surface direction, and thus, it is possible to the accurate height (depth) measurement. Although the center positions of gravity of the sub targets and the measurement boxes are the same in the example of FIG. 5, the presently disclosed subject matter is not limited thereto, and the measurement boxes can be set in arbitrary positions of the sub targets. In this case, a shifted amount between the center positions of the sub target and the measurement box is added to a measurement value.

FIG. 6 is a diagram showing an example in which the accurate measurement can be performed by acquiring not only the measurement start point and the measurement end point but also the image between these points. FIG. 6 shows an example in which not only the images of the sub targets 501 and 502 but also images of areas 601 and 602 between these images are acquired. If an image acquisition position of the sub target is shifted due to the influence of electrical charging, in the case of a sample on which the same elements are arranged, there is a possibility that an adjacent pattern which is not the measurement target will be erroneously recognized as the measurement target. Thus, in the present example, the image acquisition area is set such that the fields of view are superimposed between two targets and between adjacent image areas which are located in different positions. In the example of FIG. 6, a relative position can be adjusted between the images by forming superimposition areas 603, 604, and 605 and performing a pattern collation process (pattern matching) using the superimposition areas, and relative positions of two targets coupled by an intermediate image are accurately adjusted. The tilt boundary and the measurement target pattern are measured using the images coupled based on such an accurate position adjustment, and thus, it is possible to perform high-accuracy measurement even though the high-magnification image is the measurement target having the measurement start point and the measurement end point which are not within the range thereof and are distant from each other.

For example, in the measurement using the coupled image, it is considered that a value equivalent to L in Expression 1 by generating the luminance profile of a plurality of images and detecting a change in profile indicating the center of gravity of the pattern and the tilt boundary.

Although it has been described in the aforementioned description that the high-magnification-image acquisition area or the measurement box is manually set on the low-magnification image, a series of processes can be automatically performed based on a method to be described below. An example in which the depth measurement is automatically performed will be described with reference to FIGS. 18 and 19. FIG. 18 is a diagram showing an example of a low-magnification image 1801 including an oblique-worked area. A plurality of hole patterns 1802 is included in a display area of the low-magnification image 1801. A rect-angle 1803 represents an area worked using FIB, and the deep oblique working is performed on the lower side of this diagram.

FIG. 19 is a flowchart showing processes of performing automatic measurement on the sample illustrated in FIG. 18. Initially, the sample on which the working illustrated in FIG. 18 has been performed is introduced into the SEM (step 1901). Subsequently, the stage is moved such that a low-magnification acquisition area matches the field of view of the SEM based on FIB working positional information (step 1902). After the stage is moved, the electron beam is scanned, and the low-magnification image is acquired (step 1903). Subsequently, a high-magnification-image acquisition FOV for specifying the tilt boundary is set on the low-magnification image or based on the FIB working positional information (step 1904). In this case, since it is also considered that the FOV for high-magnification-image acquisition is not set in an accurate position due to the accuracy of the stage or the change of the process, the boundary is detected based on the aforementioned boundary determination algorithm (step 1905), and the boundary is detected by setting the field of view to be within an adjacent area in a case where the boundary is not detected. This process is repeated until the boundary is detected (search-around of step 1907). In the example of FIG. 18, in a case where there is no boundary within an initial field of view, since it is considered that the boundaries are present in different positions in the Y direction, the field of view is moved in the Y direction, and the boundary detection is performed. Subsequently, an image of an area 1804 located close to the oblique-worked surface is acquired for the detected boundary, and a template is created based on the image (steps 1906 and 1908). The template is formed such that a part of the low-magnification image is cut. Pattern search is performed toward the depth direction of the oblique-worked surface by using this template (step 1909). When the pattern search is performed, and a distance $\Delta Y_1$ from an initially matched position 1804 can be acquired by performing the pattern detection toward the depth direction from the area 1804, and a matching score can be calculated by performing template matching for each $\Delta Y_1$.

In the process of the pattern search, a position in which the matching score is equal to or less than a predetermined value is specified while performing the pattern search. In the example of FIG. 18, an area 1806 becomes a position in which the matching score is equal to or less than the predetermined value. A pattern 1808 included in the area 1806 represents a resist residue of the hole pattern, and is equivalent to the bottom of the hole pattern. The bottom of the pattern is the substantially same height as that of the oblique-worked surface, and since detection efficient of the electrons emitted from the bottom is higher than that of another hole pattern as the deep hole, this pattern is relatively brighter than another hole pattern. Since an area 1807 which is deeper than the area 1806 is an area which is deeper than the hole bottom, there is no hole pattern. Thus, if the search using the template based on the image extracted from the area 1804 is performed, the matching score in the area 1806 is lowered. For example, the matching score (matching degree) for each $\Delta Y_1$ is acquired, and thus, it is possible to specify the pattern indicating the hole bottom by specifying the portion in which the score is equal to or less than the predetermined value. In some embodiments, a calculation device can specify a position indicating a bottom of a pattern and measure a dimension between the position indicating the bottom of a pattern and a boundary.

The position of the pattern 1808 is specified by setting the FOV for the high-magnification image so as to include the pattern 1808 and acquiring the center of gravity of the pattern (steps 1910 and 1911). L in Expression 1 can be acquired by measuring the distance between the center of gravity of the pattern 1808 and the tilt boundary 1809 (step 1912). In a case where the template indicating the bottom hole is previously prepared, the pattern search using the tilt boundary 1809 as the reference point can be performed, and the portion in which the matching score is equal to or greater than the predetermined value can be specified as the pattern bottom.

It is possible to automate the high-accuracy measurement in the depth direction by storing such an operation program in the recording medium built in the memory 305 of the calculation processing device 301 or the SEM 100 and controlling the SEM 100 based on the operation program.

Although the aforementioned description primarily relates to the method of measuring the depth of the hole pattern, the aforementioned method can be applied to the evaluation of the pattern having three-dimensional structure in the height direction. For example, in the case of a transistor called FinFET, since a plurality of structures called Fin is formed in the height direction and a height of this Fin is an important element for determining the performance of a circuit, this Fin is an important evaluation item in the management of a semiconductor process. In a case where the height of Fin of such a FinFET structure is measured, the measurement using a front surface of silicon oxide buried between Fins as a reference is performed. Thus, a pattern measurement method of the presently disclosed subject matter can perform measurement of a FinFET circuit element.

Hereinafter, a preferable method for measuring the dimension of the three-dimensional structure such as Fin-FET in the height direction will be described. FIG. 12 is a diagram showing a section structure of FinFET on which the oblique working FIB has been performed. A plurality of dummy gates is arranged in parallel in a direction perpendicular to an arrangement direction of a plurality of arranged Fins. An inclined surface is formed in a direction crossing a two-dimensional plane having a virtual line which is headed for a lengthwise direction of the Fins and an arrangement direction of the Fins therein. The working is performed such that the uppermost portion and the bottom portion of the Fin are exposed on the inclined surface.

Silicon oxide is buried in a groove sandwiched between two Fins, and a front end of the Fin protrudes from a layer of oxide silicon which is an insulating material. In the FinFET transistor element, since current flows in the protruded portion, it is important to measure a width or a height of the protruded portion for each Fin in the management of a manufacturing process.

FIG. 13 is a diagram showing an image example (top-down image) acquired by imaging the oblique-worked surface using the SEM after the oblique working is performed on a sample area including FinFET.

A virtual line formed by connecting the tops of Fins 1301 is used as a reference line 1302. This line is a portion in which the Fins starts to be obliquely cut using FIB, and is an inclined-surface start point of the Fins. This line is the inclined-surface start point and is simultaneously an upper end position of the Fin. Meanwhile, a section of the Fin 1301 penetrating the inside of the dummy gate is seen on a cut inclined section of the dummy gate which is located below the reference line. Dummy gates 1303 and dummy patterns 1304 of which parts are cut by performing the oblique working are pictured on the image illustrated in FIG. 13. A layer of a silicon oxide 1305 is exposed on the worked surface by performing the oblique working.

In the present example, the height of the Fin and the width of the Fin within the dummy gate are measured in order to perform the process management.

Initially, the detailed measurement method of the height of the Fin will be described. Particularly, since current when the circuit is operated flows in the portion of the Fin 1301 exposed from the silicon oxide 1305, the distance between the upper surface of the silicon oxide 1305 and the upper end of the Fin is a parameter for determining the performance of the semiconductor device, and this dimension is appropriately managed in order to manage semiconductor production. FIG. 20 is a flowchart showing processes of measuring the height of the Fin, and a measurement system illustrated in FIG. 3 performs the measurement according to this flowchart. Initially, the sample as the measurement target is introduced into the SEM (step 2001). The oblique working has been already performed using FIB on the introduced sample, and the stage (sample stage 108) is moved such that the FOV is positioned on the oblique-worked surface (step 2002). After the stage is moved, the image is acquired (step 2003). Subsequently, template matching is performed on the acquired image by using a previously registered template (step 2004).

FIG. 21 is a diagram showing an example of the template. A template 2100 includes a part of a Fin 1301, a dummy pattern 1304 of which a part is cut using FIB, a silicon oxide 1305 exposed on the inclined surface, and a space 2101 between the lines. Since the silicon oxide 1305 exposed on the inclined surface has a luminance which is relatively higher than that of another portion and is adjacent to other members in the X direction and the Y direction, it is possible to adjust a position to an appropriate position by performing template matching using a template including the silicon oxide 1305 and other members adjacent to the silicon oxide 1305 in the X and Y directions.

Subsequently, a region of interest (ROI) is set to a portion having a predetermined positional relationship from the position specified through the template matching (step 2005). FIG. 22 is a diagram showing an example in which ROIs 2201, 2202, and 2203 are respectively set to the upper end of the Fin 1301, the upper surface of the silicon oxide on the right side of the Fin 1301, and the upper surface of the oxide silicon on the left side of the Fin 1301. The ROI are set on the image based on positional relationship information between a matching position acquired through the template matching and a position which has a predetermined positional relationship and is specified through the template matching. The position of the upper end of the Fin 1301 is detected in the ROI 2201 and the position of the boundary (upper surface of the silicon oxide) between the dummy gate 1304 and the silicon oxide is detected in the ROIs 2202 and 2203 (step 2006).

Here, in order to extract the front end of the pattern in the ROI 2201, it is considered that the front end is specified based on two-dimensionally luminance distribution information within the ROI. FIG. 23 is a diagram showing a method for specifying the front end within the ROI 2201. Within the ROI 2201 illustrated in FIG. 23(*a*), X-direction luminance distribution acquisition portions 2301 are set for different positions in the Y direction, and a front end position 2303 of the pattern is specified based on two-dimensional luminance distribution information 2302. As illustrated in FIG. 23(*b*), the luminance distribution acquisition portions 2303 can be set for different positions in the X direction, and the front end position 2303 of the pattern can be specified. In a case where the contrast of the image is insufficient and it is difficult to specify the position near the front end, the front end position can be calculated based on calculation for estimating the front end position from the curvature of the pattern near the front end. Since there is a great luminance difference between the dummy gate 1304 and the silicon oxide in the ROIs 2202 and 2203, the boundary position therebetween is acquired by acquiring the luminance distribution in the Y direction. As stated above, different detection processes can be preferably performed in the ROI for specifying the front end of the Fin and the ROIs for specifying the upper surface of the silicon oxide.

Subsequently, the dimension between the specified front end position and the upper surface of the silicon is measured (step 2007). FIG. 22 shows an example in which the ROIs are set to two left and right portions for one fin and fr and fl are acquired. In the patterns formed by a multi-patterning technology such as double patterning, the heights of the silicon oxides are changed alternately or at specified cycles. Thus, in order to quantitatively calculate the height of one fin, the dimension of the fin in the Y direction can be calculated by calculating the both left and right dimensions and calculating $L=(fr+fl)/2$. The height of the fin is calculated by substituting L calculated in this manner in Expression 1 (step 2008).

According to the operation recipe stored in such a measurement procedure, the height of the fin can be automatically acquired with accuracy.

Hereinafter, a procedure of creating the operation recipe for performing such automatic measurement will be described. FIG. 7 is a diagram showing an example of a GUI screen for registering the measurement condition. A measurement target setting area 403, a measurement target display area 402, and ROI image display areas 701 and 702 are displayed on this GUI screen based on the input using the cursor 401 or a keyboard. In the present example, the operation recipe is created using this GUI screen. The calculation processing device 301 reads design data from the design data storage medium 302 by designating the pattern or coordinate, and displays the read data in the measurement target area 402. In the present example, since it is necessary to display the oblique-worked surface on the measurement target area 402, a three-dimensional image is formed based on the design data, and the three-dimensional image is displayed on the measurement target area 402. Since how to see the oblique-worked surface is changed depending on the inclination angle of the oblique-worked surface, an angle (Tilt Angle) of the oblique-worked surface, a size (Site Size) of a worked portion, and a position (Site Location) of the worked portion can be set. The three-dimensional image is formed from the design data based on such condition setting. The working condition using FIB can be set based on such setting, and the operation recipe of the FIB device 200 can be created. The measurement recipe can be automatically set based on the setting of the working condition of the FIB device.

More detailed measurement conditions are set in the setting area 411. In the example of FIG. 7, the height of the fin or the apex of the silicon oxide and the fin as the measurement start point or end point is set as the measurement purpose. A field in which the detailed algorithm for the measurement is set is provided. "Foot" which is an algorithm appropriate for a skirt portion of the fin (boundary between the silicon oxide and the dummy gate) is selected, whereas "Peak" appropriate for the specification of the front end is selected. For example, if "Foot" is selected, an algorithm (or algorithm for detecting the tilting start point of the silicon oxide) for detecting a boundary between the silicon oxide and the dummy gate is set as the measurement condition based on the acquisition of the luminance distribution between the peak positions in the X direction. For example, if "Peak" is selected, an algorithm appropriate for the detection of the peak apex illustrated in FIG. 23 is set as the measurement condition. The working is performed such that a contact surface of the dummy gate with the silicon oxide and the oblique-worked surface cross each other, and thus, it is possible to specify the boundary line using the luminance difference between the silicon oxide and the dummy gate.

It is possible to easily set appropriate operation conditions by setting the measurement conditions using the aforementioned GUI screen.

Since the width of the Fin becomes narrower as the width becomes closer to the top, it is necessary to simultaneously measure how long a portion at which the measurement is performed descends from the top thereof when the width of the Fin is measured. Thus, L is measured. If θ is set as the incident angle of the FIB on the wafer surface, L×tan θ represents how long a portion at which the width of the Fin within the dummy gate is measured descends from the top of the Fin.

If the same measurement is performed near this measurement position while shifting an FIB oblique cut position, it is possible to measure the width of the Fin within the dummy gate for various L values. This is data indicating how much the width of the Fin is changed as it descends from the top of the Fin within the dummy gate, and the sectional shape of the Fin within the dummy gate can be ascertained based on this data. In some embodiments, the width of the fin is measured in a second position.

For example, it is possible to evaluate the pattern having the three-dimensional structure by performing a thin film having a vertical section is formed using FIB and observing the thin film sample by a transmission electron microscope (TEM). However, since about one hour is taken to cut and measure thin pieces from the wafer, a lot of time and effort are required to monitor an in-plane distribution within a wafer or chip. Meanwhile, according to the aforementioned method, since the FIB oblique cutting capable of being performed for a few minutes the CD-SEM measurement capable of being performed for about 10 seconds can be ascertained, it is possible to greatly save time and effort in the production process.

Hereinafter, an embodiment in which an FIB oblique-cutting direction according to the aforementioned embodiment is rotated by 90° will be described. FIG. 14 is a section structure of the dummy gate on which the FIB oblique cutting has been performed. FIB is incident in an orientation which is in the lengthwise direction of the dummy gate and is perpendicular to the lengthwise direction of the Fin. The section of the dummy gate is exposed from the top to the bottom on the FIB oblique-cut worked surface. In the FinFET transistor device, the dummy gate is replaced with conductive metal in the subsequent process, and switching of current flowing in the Fin is performed in only a portion in which the dummy gates are present by applying a voltage to the conductive metal. Accordingly, it is important to measure the width or the height of the dummy gate over the Fins for individual dummy gates.

An example of the section of the dummy gate acquired by observing the FIB oblique-cut portion by the SEM above the wafer surface in a top-down approach is illustrated in FIG. 15. The dummy gate is placed on the silicon oxide and is formed over the Fins. Here, it is assumed that the height used as the reference when the height of the pattern is measured is the front surface of the silicon oxide. It is assumed that a line in which this front surface starts to be obliquely cut using FIB is the reference line. The section of the cut inclined dummy gate pattern is displayed on the SEM image on which the FIB oblique-drilled surface is pictured. The section of the dummy gate pattern is exposed on the oblique-drilled surface. For example, the top portion of the dummy gate is automatically recognized, and a line width of this portion is measured. Subsequently, a "height reference line" as a reference point of the height measurement of the pattern is set. For example, the boundary line in which the image contrast is rapidly changed is seen between the FIB worked surface and the un-worked surface, or the image contrast is also rapidly changed since a material of the bottom of the dummy gate is changed from the polysilicon to silicon oxide in a structure in which the dummy gate is placed on the silicon oxide. The height reference line is set in the boundary line in which such contrast is changed.

The distance between the height reference line and the top portion of the dummy gate, that is, the interval on the SEM image in a longitudinal direction is measured. A "height difference in a layered direction" in an actual pattern structure is calculated from this distance. Measurement output data is only the height difference or a pair of a height difference and a line-width-dimension measurement value.

The section of the dummy gate exposed on the cut inclined surface extends downwards but stops at a position in which the section of the dummy gate collides with the section of the silicon oxide present immediately under the dummy gate. This is because the dummy gate is placed on the silicon oxide. Accordingly, in order to find the reference line, a position in which the section of the dummy gate is cut at the lower portion can be found.

It can be seen that the width of the Fin represents a height dimension of the Fin within the dummy gate, which can be measured by the distance L from the reference line to the Fin within the dummy gate and calculating L×tan θ.

Incidentally, instead of measuring the shapes or depths of the patterns and averaging the measured values, the images acquired by respectively observing the patterns with a high magnification can be superimposed, a combined pattern image can be generated, and the shape or dimension thereof can be measured. Although it has been assumed in the aforementioned description that the shapes or dimensions of the patterns are substantially equal, the shapes or dimensions of the patterns assumed to be uniform can be visually checked through the combined image as long as the combined image can be generated in this manner. It is possible to visually check the three-dimensional structure of the pattern as long as the three-dimensional image can be generated by arranging the combined images for the respective depths which are generated in this manner in the longitudinal direction. As stated above, it is important to visually recognize the shapes or dimensions of the patterns through the three-dimensional image in addition to numerically managing the process.

Incidentally, for example, a method of measuring whether or not the deep hole is straightly open in a direction perpendicular to the wafer surface in the process of forming the deep hole pattern will be described. FIG. 16 shows a measurement example of the bending of the deep hole working. This diagram is a schematic diagram showing a top-down image of a deep-hole worked area, and the FIB oblique-drilled surface that descends toward the bottom from the top is seen. The un-worked sample surface is present in the upper, left and right portions, and entrances of the deep holes are seen. If the deep holes are vertically drilled in the sample surface, the entrances of the deep holes and the sectional shape of the worked area are seen so as to be arranged in a virtual straight line in a horizontal or vertical direction in this diagram.

However, if the deep holes are vertically tilted or are bent in the middle, the sectional shapes exposed on the oblique-drilled surface can be arranged in a virtual straight line. In other words, the positions of the contact holes in a direction perpendicular to the depth direction of the control holes are displaced. The measurement target patterns are shifted toward the right from the virtual straight line by B. The measurement target patterns are separated by the distance L from the reference line. Thus, it can be seen that the measurement target pattern is shifted toward the right by B at a position in which the depth from the wafer surface is L×tan θ. That is, it can be seen that the measurement target pattern is bent toward the right in a deep portion. For example, in order to specify the depth of the portion in which the contact hole is bent in this manner, it is considered that the search using the template illustrated in FIG. 18 is performed toward the Y direction and the portion (portion in which the score is decreased due to the shift of the pattern) in which the matching degree is equal to or less than the predetermined value is used as the reference for performing the depth measurement. Another algorithm for specifying a bent point of the arrangement of the straightly arranged patterns can be applied. In some embodiments, a calculation device can specify a position in which the pattern is displaced in a direction perpendicular to a depth direction of a pattern and measure a dimension between the position and a boundary.

FIG. 17 shows a measurement example of a sidewall angle of the Fin. It is assumed that an angle formed by a sidewall of a certain portion of a certain Fin pattern and a horizontal direction of the screen is α. It is assumed that the distance between the position within the screen in which the angle is measured and the reference line is L. In this case, a sidewall angle ζ formed by the actual Fin pattern and a horizontal plane of the wafer surface is calculated by the following expression.

$$\zeta = \tan \alpha \times \tan \theta \text{[Expression 2]}$$

It is considered that the sidewall angle exposed on an inclined section is apparently changed by a slope θ of an inclined section.

It is known that the planar unevenness of the sidewall of the Fin influences electrical characteristics of a FinFET device. Thus, it is important to manage the process by measuring the planar unevenness of the sidewall in the production process. However, since a sidewall surface has a substantially horizontal angle to the incident direction of the electron beam on the SEM image, the unevenness of the sidewall surface is rarely seen on the SEM image.

However, it is possible to relatively easily capture the unevenness on the top-down SEM image on the surface on which the oblique drilling has been performed using FIB. This is because the sectional shape in which the sidewall of the Fin pattern is cut by a plane substantially perpendicular to the sidewall surface is captured on the top-down SEM image of the inclined surface if the inclined surface that descends toward the lengthwise direction of the Fin line is formed through the FIB oblique drilling. It is observed that line edge roughness (LER) of the Fin sidewall is changed for the height direction of the Fin. It is possible to more clearly observe the LER of the sidewall unlike a method of performing measurement on a top-down SEM of a Fin pattern in which the oblique drilling is not performed in the related art. This is because the drilled inclined surface cuts the side wall, and an edge of about 90° is shown in this portion. Such an edge is clearly pictured on the SEM image, but such an edge is not present in a case where the hole is not obliquely drilled. The sidewall LER changed in the height direction of the Fin as it is headed for the lengthwise direction of the Fin line pattern is pictured. Since the sidewall LER is the LER including both the LER in the lengthwise direction and the LER of the sidewall in the height direction, this sidewall LER can be applied in the process management, as an index indicating the unevenness of the sidewall.

The SEM 100 and the FIB device 200 can be independent devices, but can be connected via a network through LAN communication. Initially, the coordinate information on the worked wafer in the FIB device is transmitted to the SEM 100 via the network. In a case where the FIB-SEM on which the SEM is mounted on the FIB device is used as the working device, the top-down image acquired by the SEM mounted on the FIB together with the coordinate data can be transmitted to the SEM 100. As long as the SEM can be controlled using the previously acquired coordinate data, it is possible to automatically position the measurement target portion in the position of the field of view of the SEM.

Since the coordinate data is transmitted from the FIB, the worked portion is searched using this portion as a center. If the SEM image of the worked portion is transmitted, it is possible to automatically search for a place similar to this image within the wafer surface. The data measured in the SEM device can be transmitted to external storage medium through the LAN communication.

Incidentally, in a case where two different types of pattern shapes are pictured on the FIB worked section, it is possible to measure overlay (OVL) for quantitatively measuring a shift of a positional relationship therebetween. For example, in a via-trench structure in which via holes (holes) are formed in a bottom of a groove (trench), since it is important to form the holes such that a center of the hole is positioned in a center line of the trench, the overlay measurement for measuring a shifted amount thereof is required in terms of the process management. However, since the secondary electrons generated from the bottom become difficult to reach the detector as the groove becomes deeper, an image of the hole of the groove bottom is not relatively vivid, and accuracy tends to be relatively low in the OVL measurement of the center line of the groove and the center of the hole.

Thus, the working is performed using the FIB such that the oblique-drilled inclined surface descends in the lengthwise direction of the groove, and thus, it is easier to detect the secondary electrons from the hole of the groove bottom as the inclined surface becomes deeper. Thus, the image of the hole tends to become more vivid. For example, in the example of FIG. 12, there is a groove between the Fin and the Fin, and the substantially center of the groove is buried in the silicon oxide. As stated above, the working for cutting the sample by obliquely applying FIB from the top of this diagram toward the bottom is performed such that the sectional shape of the groove from the upper end to the bottom (from the upper end of the Fin to the bottom) is seen, and thus, the aforementioned effect can be expected.

Thus, since the position of the center point of the hole can be measured with more accuracy, it is possible to improve the accuracy of the OVL measurement. If the depth of the inclined surface is deeper than the bottom, since the section of the hole formed in the groove bottom is seen on the inclined surface, a change in shape of the hole in the depth direction or whether or not the hole is straightly formed in the direction perpendicular to the wafer surface can be quantitatively measured by measuring these depths.

As the OVL measurement, various measurements such as OVL measurement of a resist pattern on a wafer surface and a pattern formed within the wafer can be applied. Particularly, in a case where the pattern within the wafer is located at a depth of several microns or more from the surface, it is possible to perform the OVL measurement with higher accuracy than that of the measurement using a general SEM. This is because it is difficult to sufficiently trap the secondary electron emitted from the hole bottom and image quality of the pattern is extremely deteriorated in the measurement using the general SEM.

In a case where it is easy to electrically charge the wafer surface, if the wafer surface is irradiated with the electron beam, the pattern within the wafer and the wafer surface are paired and locally serve as a condenser, and thus, the wafer surface can be locally charged by electric charges trapped in electrostatic capacitance. Since the orbit of the electrons emitted from the sample is changed by the electrical charging, an observed image is also an image that reflects the electrical charging. However, since this charged image is not the pattern within the wafer and the contour of the charged area is also not vivid, there is a possibility that the charged image will deteriorate the accuracy of the OVL measurement. Meanwhile, since it is possible to measure a pattern of a real object appearing on the front surface of the inclined surface by performing the measurement based on the oblique working and it is possible to directly measure the secondary electrons from the measured pattern, the contour of the pattern becomes more vivid, and thus, it is possible to improve the accuracy of the OVL measurement.

The wafers in which the holes are obliquely drilled using FIB are returned to a production line without being discarded, and thus, yield can not be decreased. It is difficult to reuse the portion worked using FIB in the subsequent process. However, the subsequent process is performed on other undamaged portions, and these portions can function as devices. For example, a shot or a chip including the portion worked using FIB is actually recorded, and only the shot is discarded after the subsequent dicing process. In the FIB working, the device pattern is covered with the carbon protective film, Ga metal contamination is caused by a Ga ion beam, or foreign substance contamination due to particles scattered from this portion is caused. However, since such an area has a diameter size of about several microns using the FIB worked portion as a center, if this portion is discarded for each shot having a size of about 10 millimeters or more, it is possible to acquire other shots as good-quality products with no influence.

A wide area on the front surface or rear surface of the wafer is contaminated by foreign substances due to particles generated from the FIB device in some cases. In a typical FIB working device, a gimbal mechanism capable of tilting the stage on which the wafer is mounted in various directions is provided, and the incident direction of the FIB on the wafer surface can be changed.

However, since such a gimbal mechanism has a relatively complicated mechanical structure, the particles are generated from this portion, and thus, the foreign substance contamination can be caused on the rear surface or front surface of the wafer.

Thus, the stage having a relative simple structure capable of horizontally holding the wafer without tilting the wafer is used without using such a gimbal mechanism, and an FIB column is fixed at an elevation angle of 40° with respect to the front surface of the wafer. By doing this, since the occurrence of the foreign substances from the gimbal mechanism can be prevented, it is possible to prevent the wafer from being contaminated by the foreign substances, and it is possible to return the wafer to the production process.

If the elevation angle with respect to the wafer is set to be 40° or less, since the column is in contact with the wafer due to limitations of the structure of the FIB column, the elevation angle is reduced as small as possible. This is because more sectional shapes can be pictured on the FIB worked surface as the elevation angle becomes smaller. By doing this, the change of the sectional shape in the depth direction can be more finely measured. In other words, if a simple device structure in which the wafer stage and the FIB column are fixed such that the elevation angle is reduced as small as possible without variously changing the elevation angle by the gimbal mechanism is achieved, it is possible to more finely measure a change in dimension of the pattern in the depth direction by performing the oblique drilling, and it is possible to perform the measurement without deteriorating the yield since the wafer having no contamination of the foreign substances is returned to the production process. Accordingly, it is possible to further reduce equipment investment by suppressing device prices since the device has a simple structure.

In the aforementioned device structure, a mechanism for rotating the wafer is required using a normal line of the wafer surface which penetrates the center point of the wafer as a rotational axis. For example, the Fin line and the Gate line are formed in the FinFET device so as to be perpendicular to each other, and thus, it is necessary to perform the oblique drilling using FIB in two directions in order to measure the changes in the shapes of both the lines in the depth (height) direction. However, if the mechanism for rotating the wafer stage is provided, particles are generated from this mechanism, and thus, the contamination can be caused by the foreign substances.

Thus, a mechanism for rotating the wafer at an arbitrary angle before the wafer is introduced into a vacuum chamber of the FIB is provided. The wafer can be mounted on the wafer stage and oblique drilling using FIB can be started while rotating the wafer using an orientation flat of the wafer as a marker at an angle such that the lengthwise direction of the Fin line or Gate line is parallel to the FIB beam.

REFERENCE SIGNS LIST

100 SEM
101 Electron source
102 Extracting electrode
103 Electron beam
104 Condenser lens
105 Scanning deflector
106 Objective lens
107 Vacuum sample chamber
108 Sample stage
109 Sample
110 Electron
111 Secondary electron
112 Conversion electrode
113 Detector
120 Control device
200 FIB device
201 Liquid metal ion source
202 Extracting electrode
203 Emission ion
204 Aperture
205 Focusing lens
206 Sample
207 Blanker
208 Diaphragm
209 Aligner
210 Deflector
211 Objective lens
212 Sample stage
214 Secondary electron detector
215 Control device
301 Calculation processing device
302 Design data storage medium

The invention claimed is:

1. A pattern measurement method of performing measurement of a pattern which can include a hole, a groove, or a three-dimensional structure formed on a sample, based on a detection signal acquired by a scanning electron microscope, the method comprising:

a step of forming an inclined surface in a sample area where plural patterns are arranged by irradiating the sample area with an ion beam so that an area deeper than a bottom of the pattern is exposed;

a step of setting a first field of view of the scanning electron microscope such that the field of view includes a boundary between the inclined surface and a sample surface of the sample, and acquiring a first image of the first field of view based on a detection signal acquired by scanning the first field of view with an electron beam;

a step of specifying a first position as the boundary by using the acquired first image;

a step of specifying a second position as the bottom of the pattern positioned within the inclined surface by performing a pattern search; and a step of calculating a dimension of the pattern in a depth direction based on a dimension in the sample surface direction between the first position and the second position and an angle of the inclined surface.

2. The pattern measurement method according to claim 1, wherein the pattern is a contact hole formed on a semiconductor wafer.

3. A pattern measurement device that measures a dimension of a pattern which can include a hole, a groove, or a three-dimensional structure formed on a sample, based on a detection signal acquired by a scanning electron microscope, the device comprising:

a calculation device that specifies a first position as a boundary between an inclined surface and a non-inclined surface of the sample based on an image acquired by the scanning electron microscope, wherein the inclined surface is formed in a sample area where plural patterns are arranged by irradiating the sample area with an ion beam so that an area deeper than a bottom of the pattern is exposed, specifies a second position as the bottom of the pattern positioned within the inclined surface by performing a pattern search, measures a dimension in a sample surface direction between the first position and the second position and calculates a dimension of the pattern in a depth direction based on the measured dimension value between the first position and the second position and a relative angle between the inclined surface and a sample surface.

4. The pattern measurement device according to claim 3, wherein the calculation device specifies the first position and the second position, based on images acquired from at least two positions of fields of view.

5. The pattern measurement device according to claim 3, wherein the calculation device specifies a center of gravity of the pattern, and measures a dimension between the center of gravity and the boundary.

6. The pattern measurement device according to claim 3, wherein the calculation device specifies a position indicating a bottom of the pattern, and measures a dimension between the position indicating the bottom of the pattern and the boundary.

7. The pattern measurement device according to claim 3, wherein the calculation device specifies a position in which the pattern is displaced in a direction perpendicular to the depth direction of the pattern, and measures a dimension between the position and the boundary.

8. The pattern measurement method according to claim 1, further comprising:
a step of setting a second field of view of the scanning electron microscope such that the field of view includes the of the pattern, and acquiring a second image of the second field of view based on the bottom detection signal acquired by scanning the second field of view with an electron beam;
wherein the second position is specified by using the acquired second image.

9. A non-transitory computer readable medium, storing program instructions executable on a computer system for performing a computer-implemented method for measuring a dimension of a pattern which can include a hold, a groove, or a three-dimensional structure formed on a sample, based on a detection signal acquired by a scanning electron microscope, wherein the computer-implemented method comprises:

specifying a first position as a boundary between an inclined surface and a non-inclined surface of the sample based on an image acquired by the scanning electron microscope, wherein the inclined surface is formed in a sample area where plural patterns are arranged by irradiating the sample area with an ion beam so that an area deeper than a bottom of the pattern is exposed;
specifying a second position as the bottom of the pattern positioned within the inclined surface by performing a pattern search;
measuring a dimension in a sample surface direction between the first position and the second position; and
calculating a dimension of the pattern in a depth direction based on the measured dimension value between the first position and the second position and a relative angle between the inclined surface and a sample surface.

10. The non-transitory computer readable medium according to claim 9, wherein the first position and the second position are specified based on images acquired from at least two positions of fields of view.

11. The pattern measurement method according to claim 8, wherein the second position is specified by acquiring a center of gravity of the pattern for measuring the dimension in the sample surface direction between the first position and the second position.

12. The non-transitory computer readable medium according to claim 10, wherein the second position is specified by acquiring a center of gravity of the pattern for measuring the dimension in the sample surface direction between the first position and the second position.

* * * * *